(12) United States Patent
Park et al.

(10) Patent No.: US 12,107,188 B2
(45) Date of Patent: Oct. 1, 2024

(54) SEMICONDUCTOR DEVICE

(71) Applicant: SUZHOU LEKIN SEMICONDUCTOR CO., LTD., Taicang (CN)

(72) Inventors: Duk Hyun Park, Seoul (KR); Byung Hak Jeong, Seoul (KR); Jee Yun Lee, Seoul (KR)

(73) Assignee: SUZHOU LEKIN SEMICONDUCTOR CO., LTD., Suzhou (CN)

( * ) Notice: Subject to any disclaimer, the term of this patent is extended or adjusted under 35 U.S.C. 154(b) by 775 days.

(21) Appl. No.: 17/255,576

(22) PCT Filed: Jul. 2, 2019

(86) PCT No.: PCT/KR2019/007990
§ 371 (c)(1),
(2) Date: Dec. 23, 2020

(87) PCT Pub. No.: WO2020/013501
PCT Pub. Date: Jan. 16, 2020

(65) Prior Publication Data
US 2021/0288219 A1    Sep. 16, 2021

(30) Foreign Application Priority Data
Jul. 11, 2018  (KR) .................. 10-2018-0080726

(51) Int. Cl.
*H01L 33/38* (2010.01)
*H01L 33/40* (2010.01)
*H01L 33/62* (2010.01)

(52) U.S. Cl.
CPC .......... *H01L 33/382* (2013.01); *H01L 33/405* (2013.01); *H01L 33/62* (2013.01)

(58) Field of Classification Search
CPC ..... H01L 33/382; H01L 33/405; H01L 33/62; H01L 33/387; H01L 33/10
See application file for complete search history.

(56) References Cited

U.S. PATENT DOCUMENTS

| | | | |
|---|---|---|---|
| 2015/0255675 A1* | 9/2015 | Song | H01L 33/382 257/99 |
| 2018/0212111 A1* | 7/2018 | Yim | H01L 33/405 |
| 2020/0350467 A1* | 11/2020 | Lin | H01L 33/405 |

FOREIGN PATENT DOCUMENTS

| | | |
|---|---|---|
| JP | 2012-195321 A | 10/2012 |
| KR | 10-2011-0113822 A | 10/2011 |

(Continued)

OTHER PUBLICATIONS

International Search Report dated Oct. 4, 2019 issued in Application No. PCT/KR2019/007990.

*Primary Examiner* — Syed I Gheyas
(74) *Attorney, Agent, or Firm* — Birch, Stewart, Kolasch & Birch, LLP

(57) ABSTRACT

An embodiment provides a semiconductor device comprising: a substrate; a bonding layer disposed on the substrate; an electrode layer disposed on the bonding layer; a semiconductor structure disposed on the electrode layer and including a first conductive semiconductor layer, a second conductive semiconductor layer, and an active layer disposed between the first conductive semiconductor layer and the second conductive semiconductor layer; a first electrode electrically connected to the first conductive semiconductor layer; and a second electrode electrically connected to the second conductive semiconductor layer, wherein the second conductive semiconductor layer includes a through-hole, and the second electrode is disposed in the through-hole so as to be electrically connected to the electrode layer.

9 Claims, 16 Drawing Sheets

(56) References Cited

FOREIGN PATENT DOCUMENTS

| | | |
|---|---|---|
| KR | 10-2012-0006257 A | 1/2012 |
| KR | 10-2013-0043708 | 5/2013 |
| KR | 10-2014-0018534 | 2/2014 |
| KR | 10-2014-0073284 | 6/2014 |
| KR | 10-2015-0137615 A | 12/2015 |
| KR | 10-2016-0008745 | 1/2016 |
| KR | 10-2016-0115868 | 10/2016 |
| WO | WO-2017014580 A1 * | 1/2017 ............ H01L 33/36 |

* cited by examiner

[FIG.1]
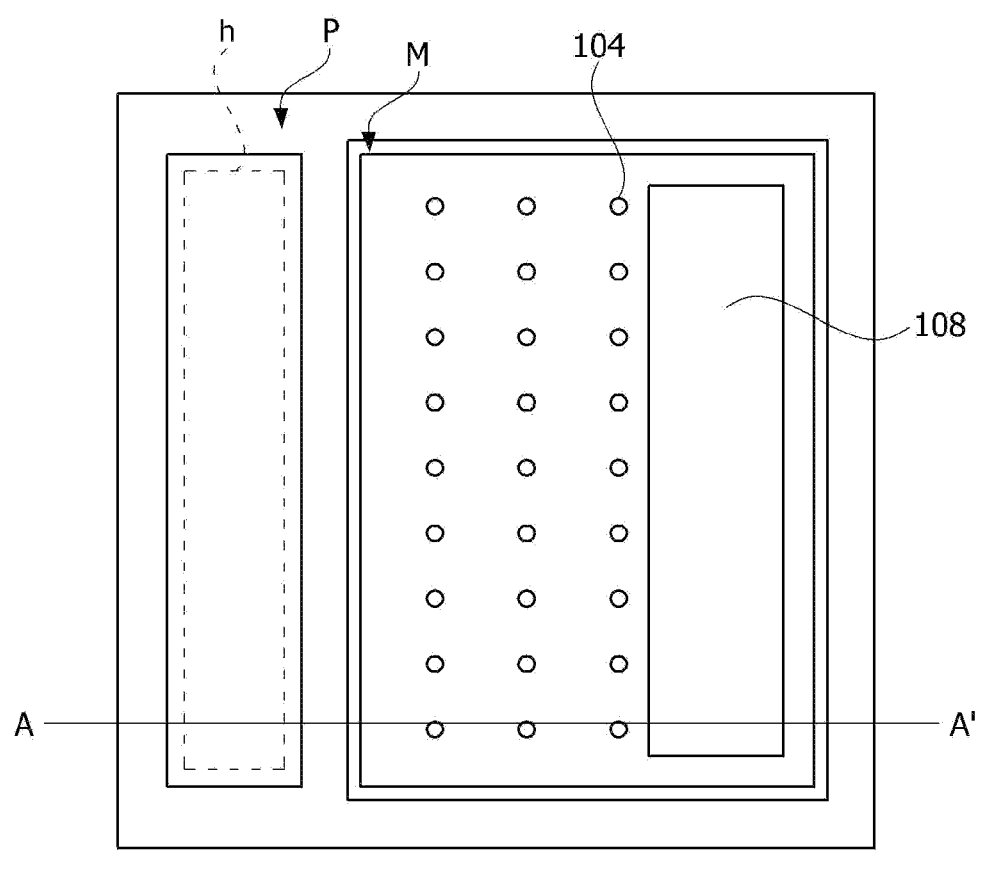

[FIG.2]
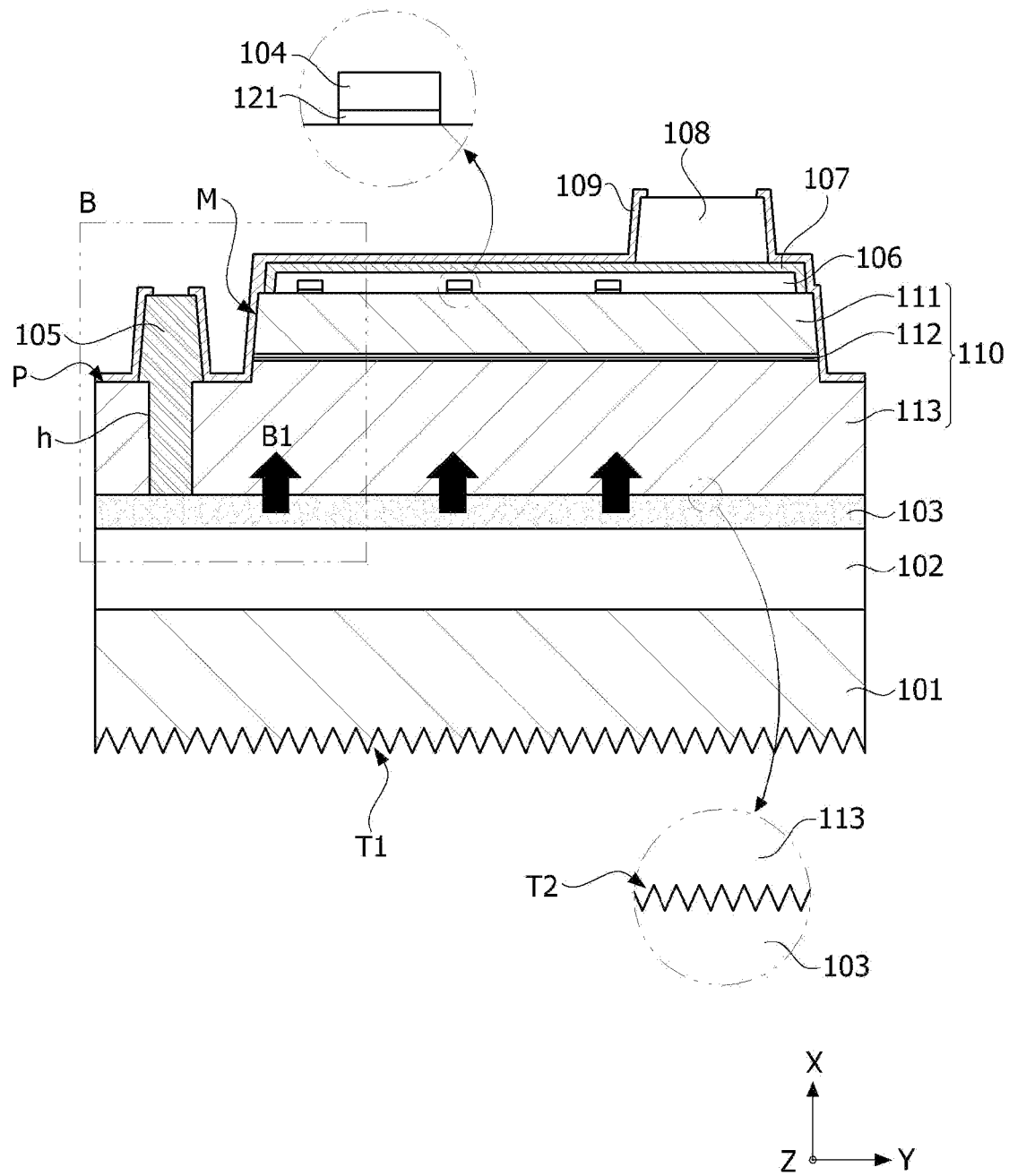

【FIG.3】
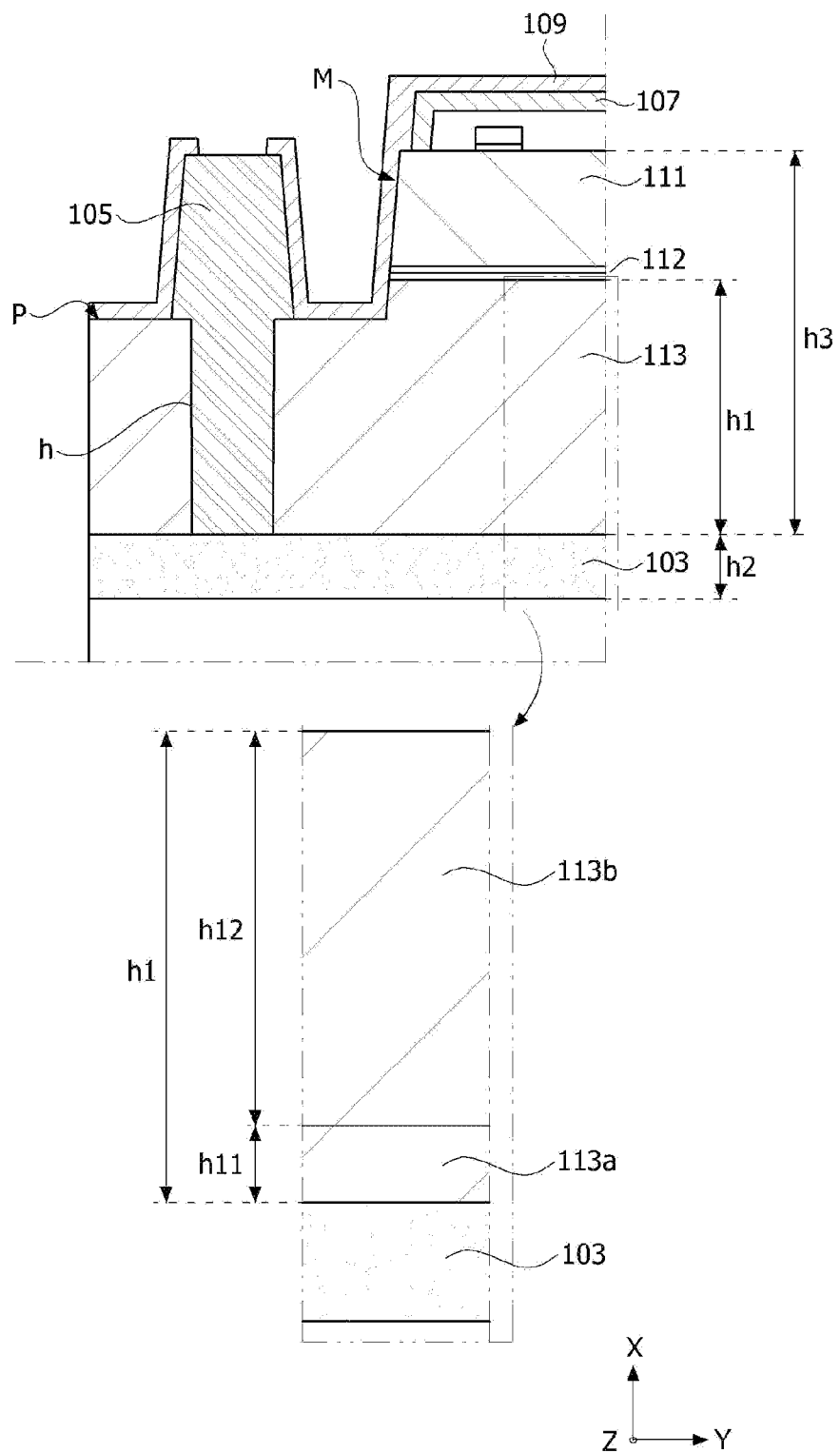

[FIG.4]
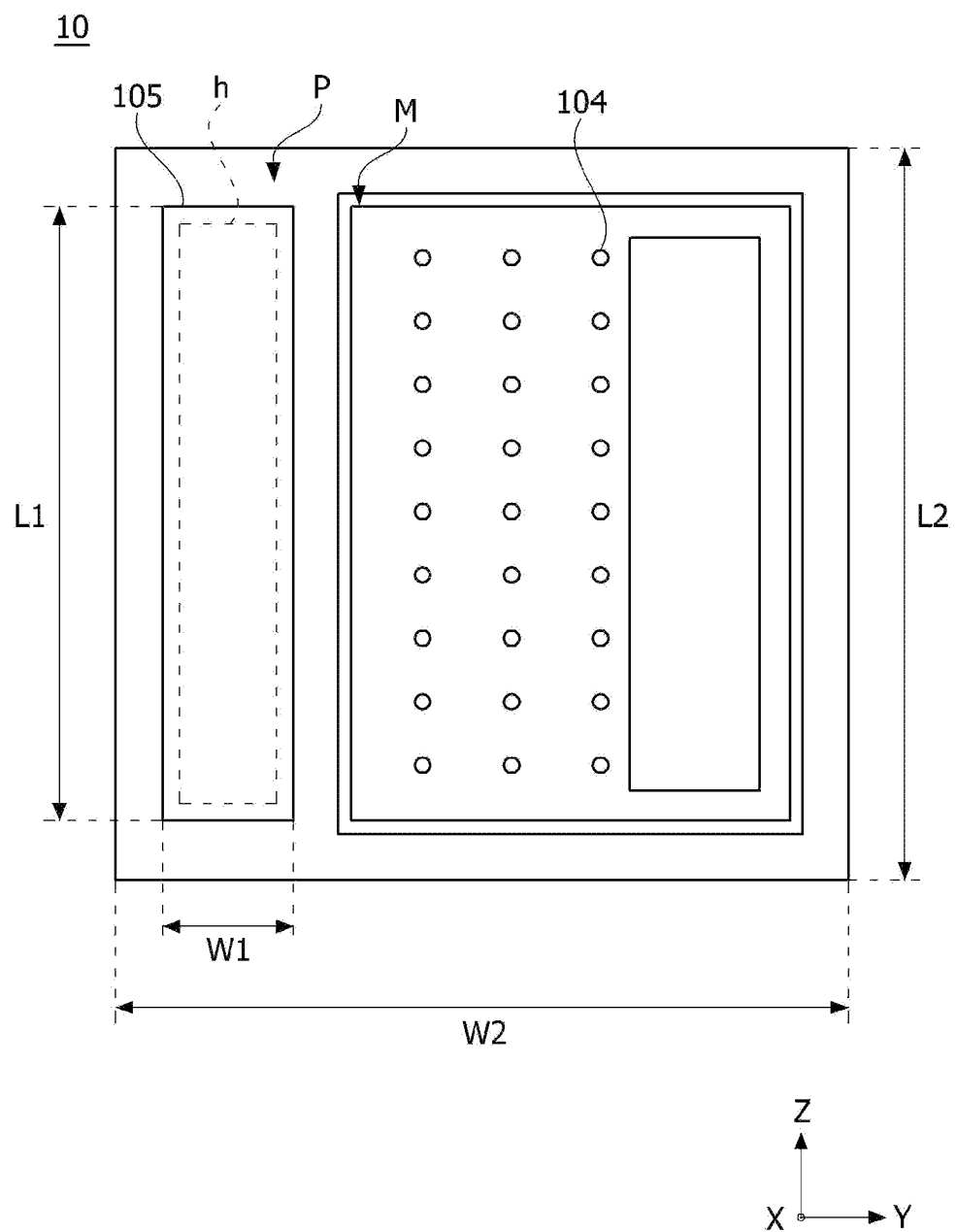

[FIG.5A]
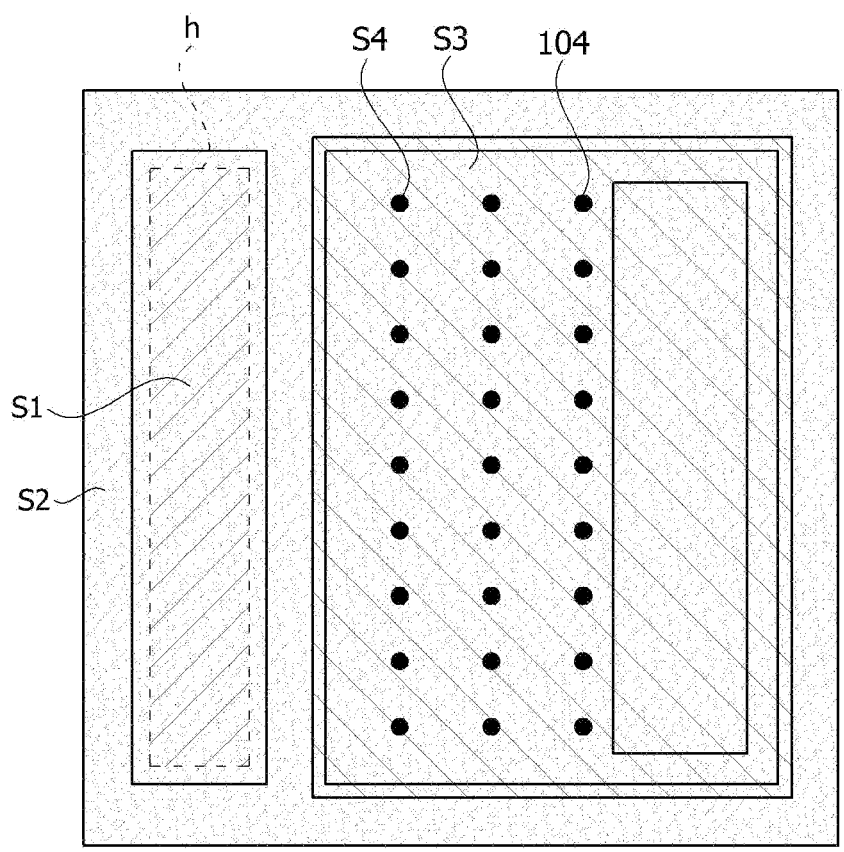

[FIG.5B]
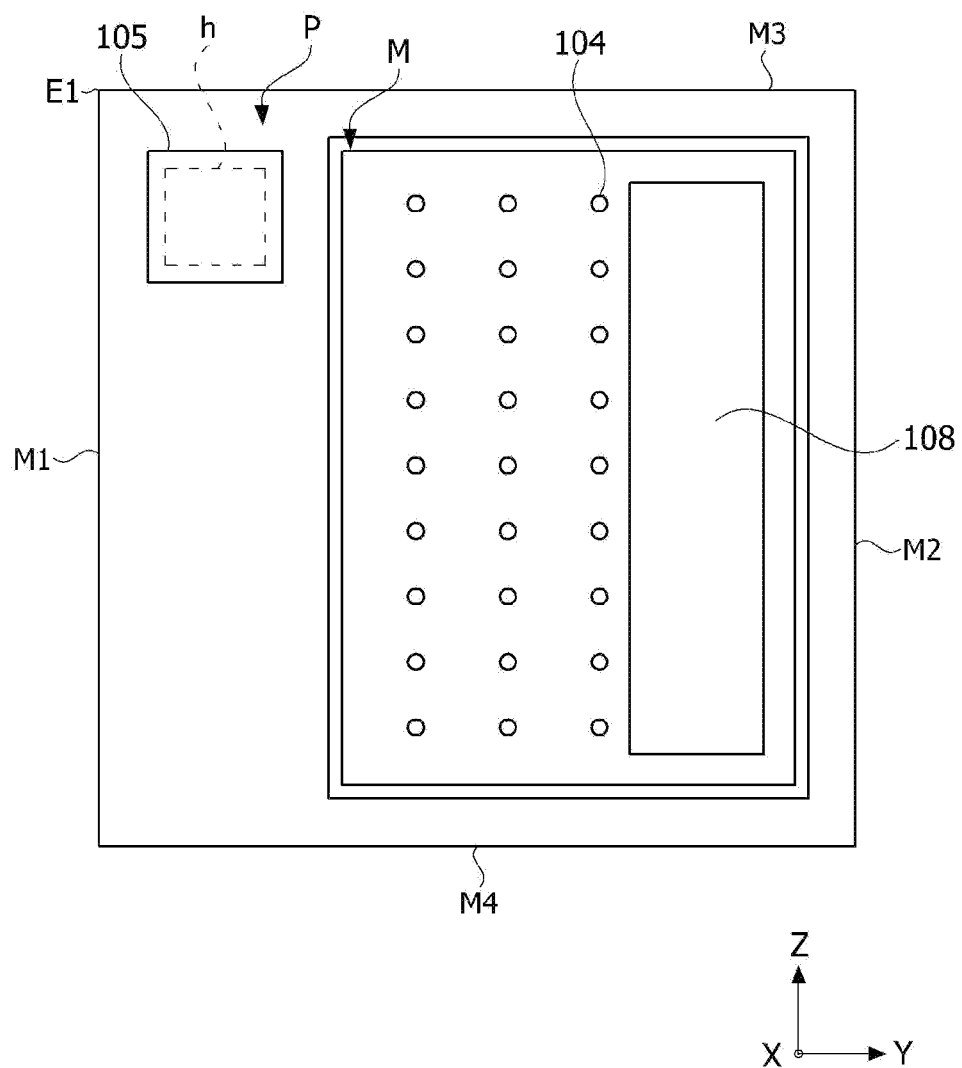

[FIG.6]
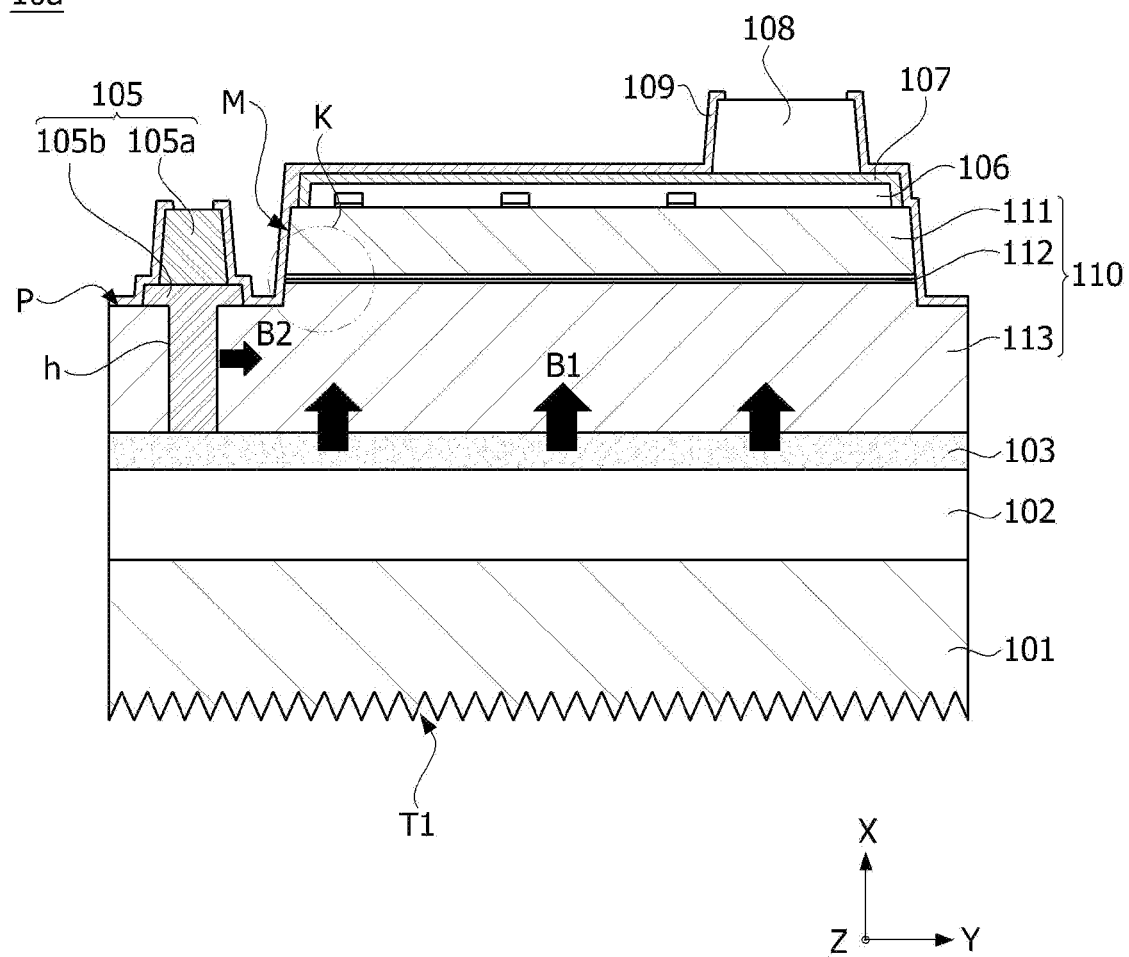

[FIG.7]
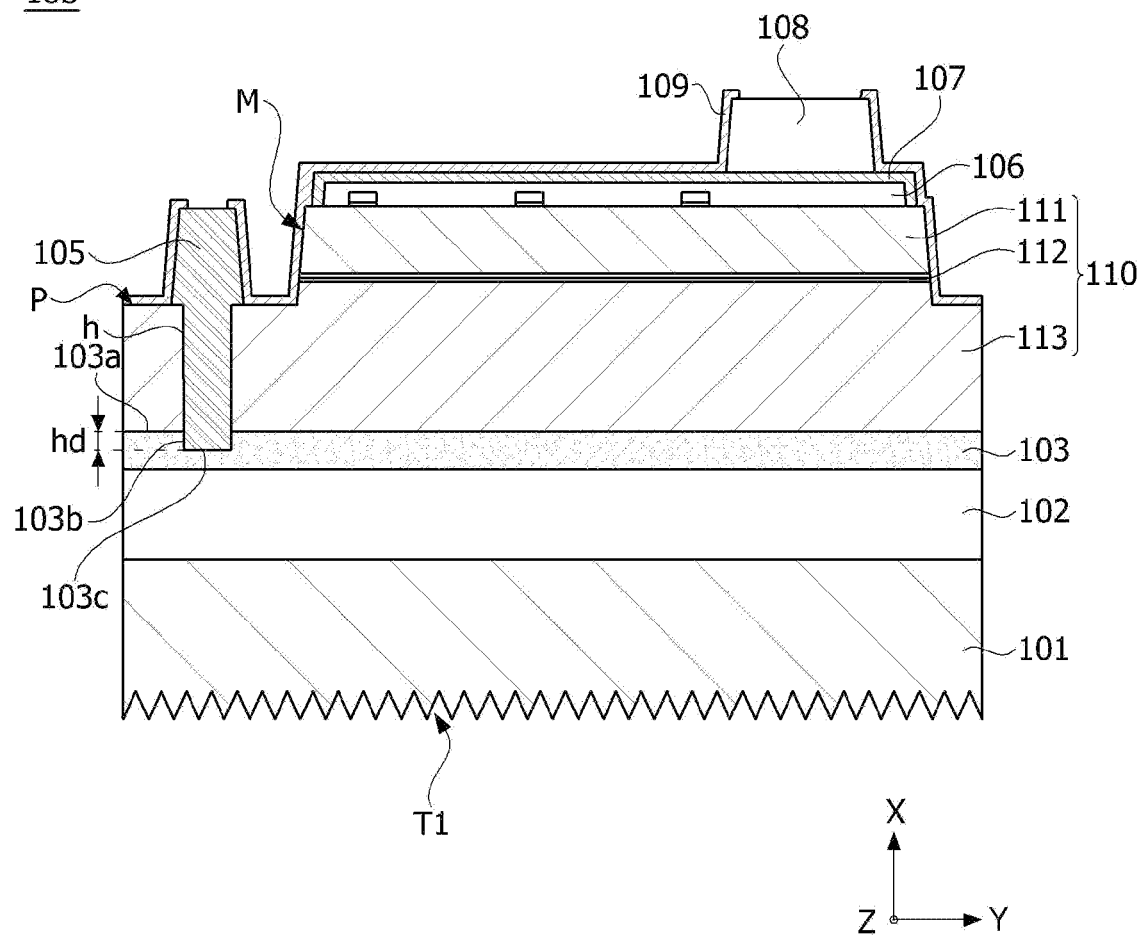

[FIG.8]
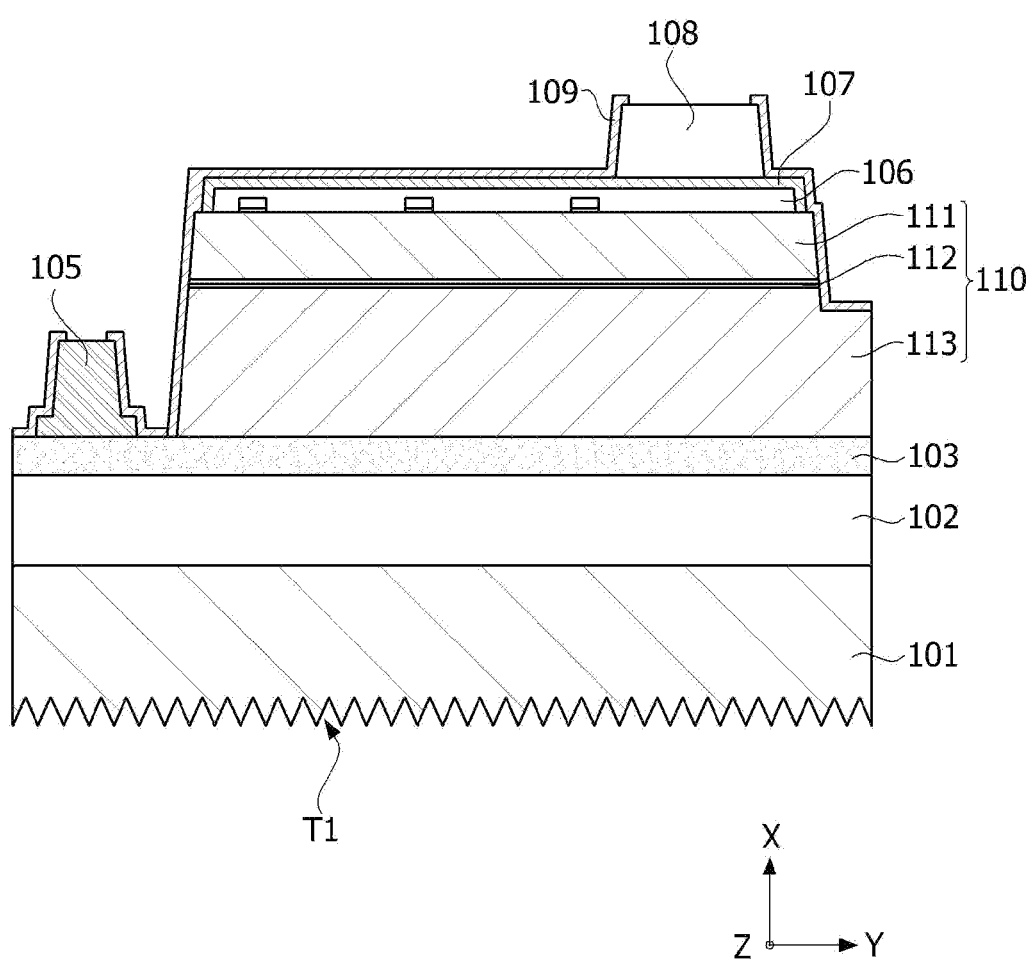

[FIG.9]
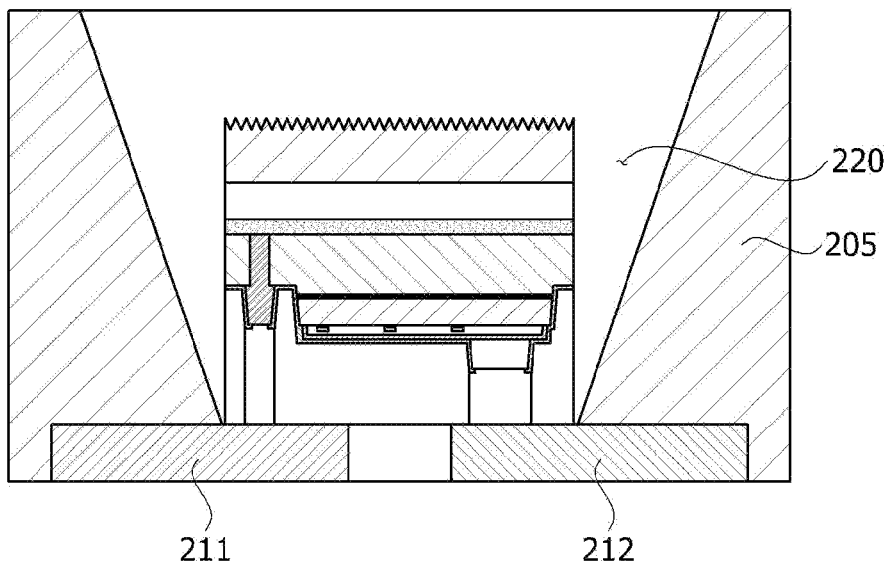
[FIG.10A]
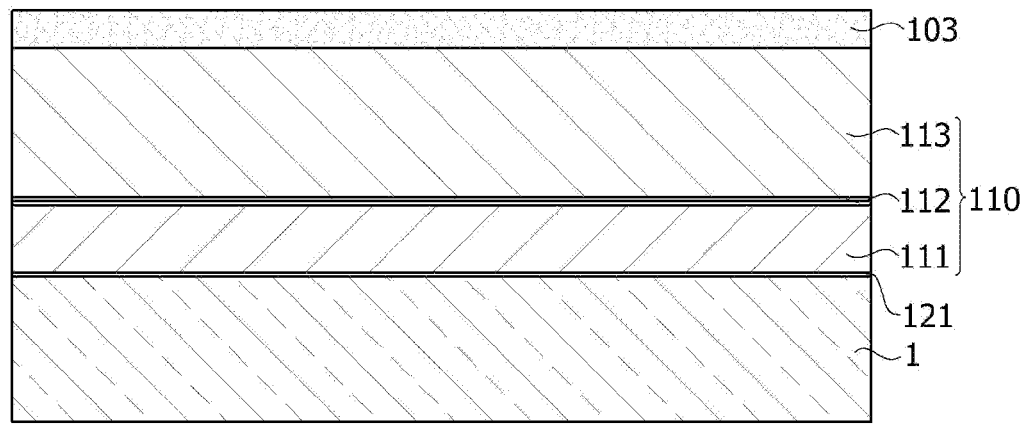

[FIG.10B]
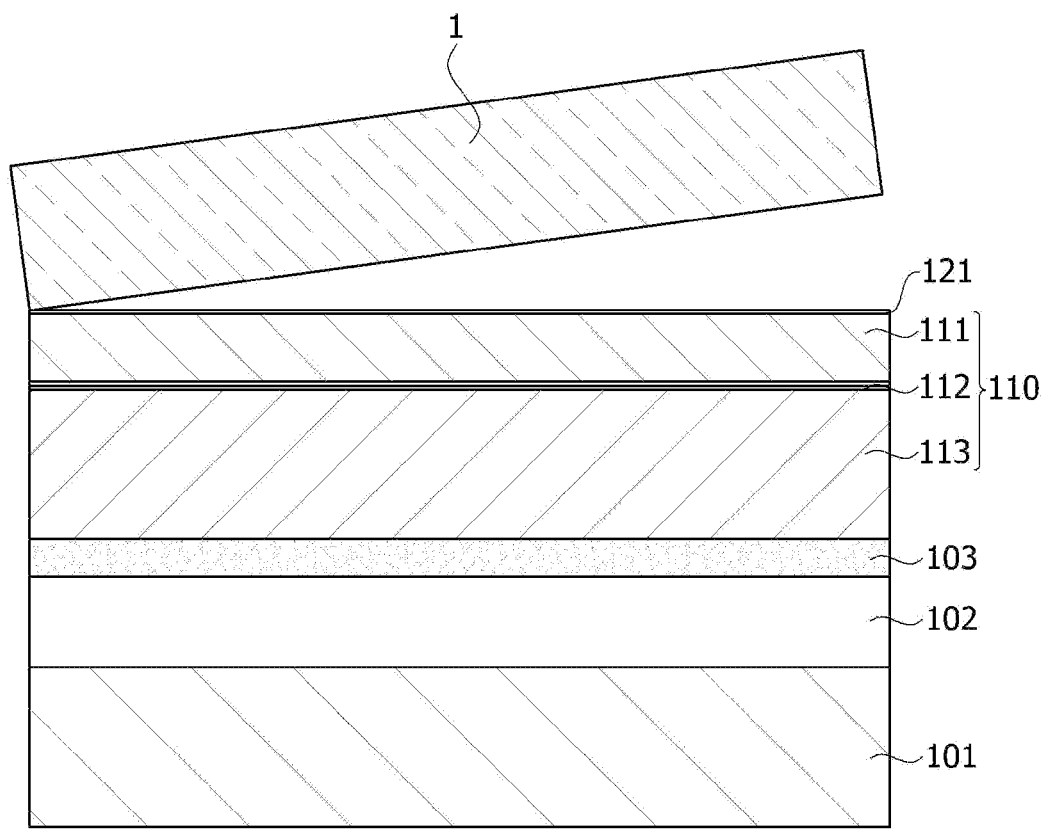

【FIG.10C】
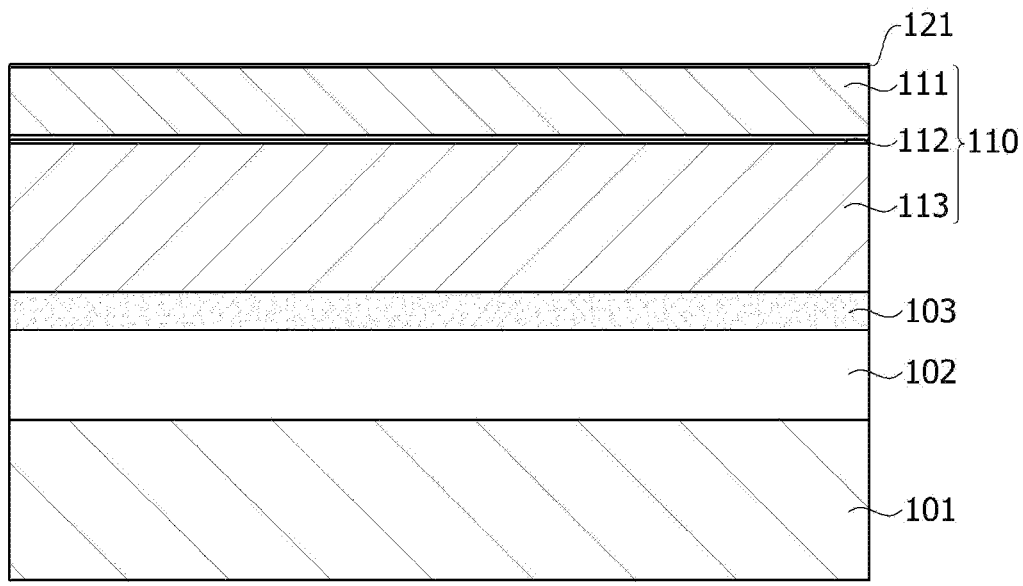
【FIG.10D】
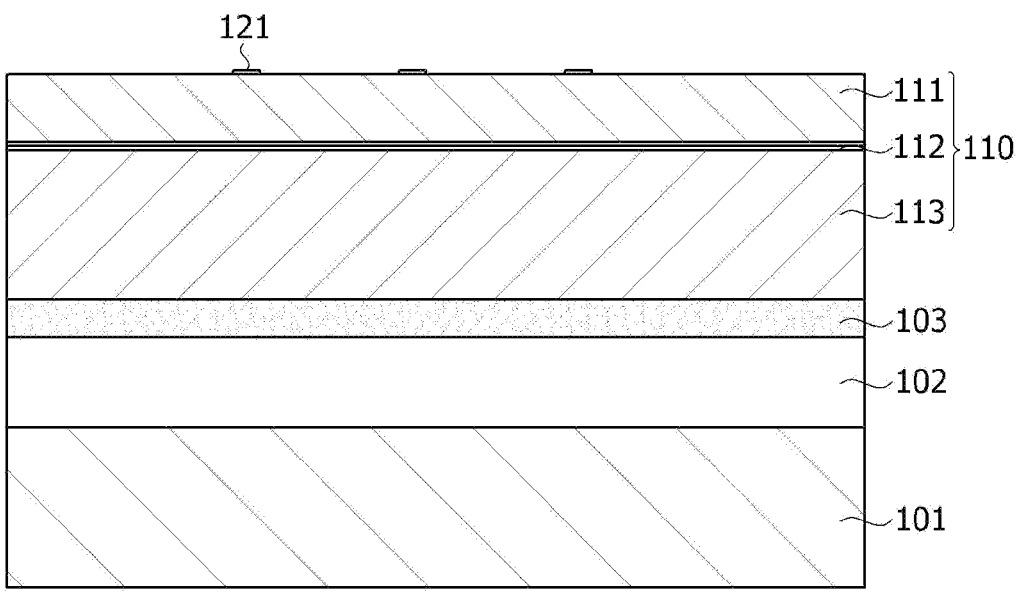

【FIG.10E】
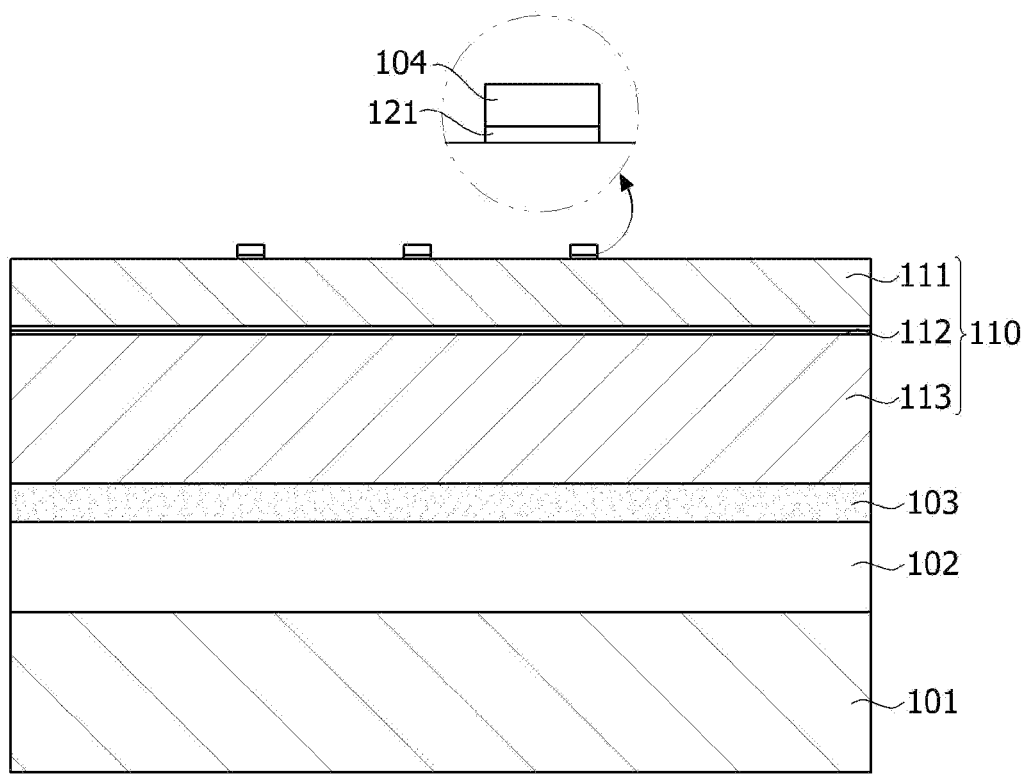
【FIG.10F】
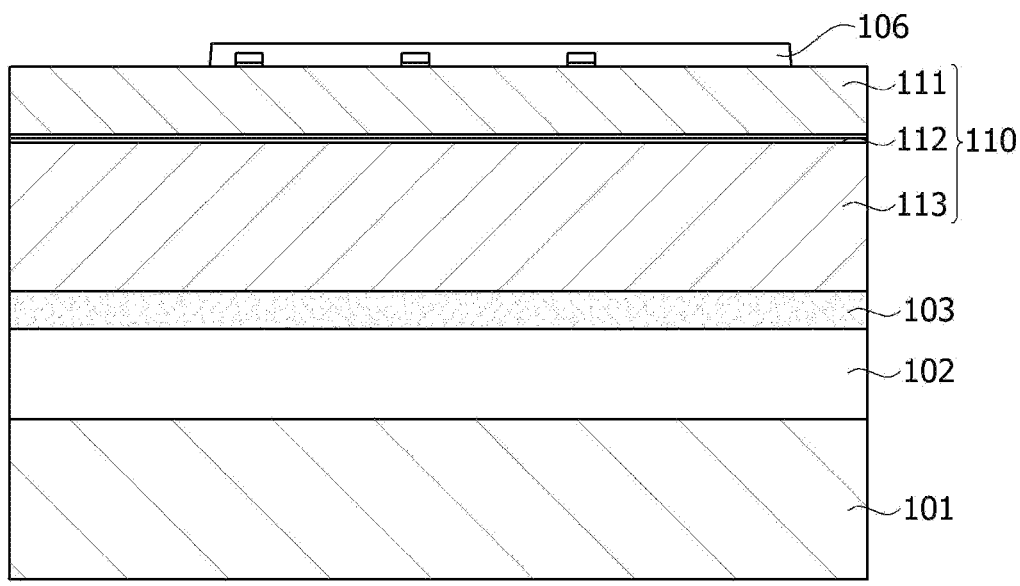

[FIG.10G]
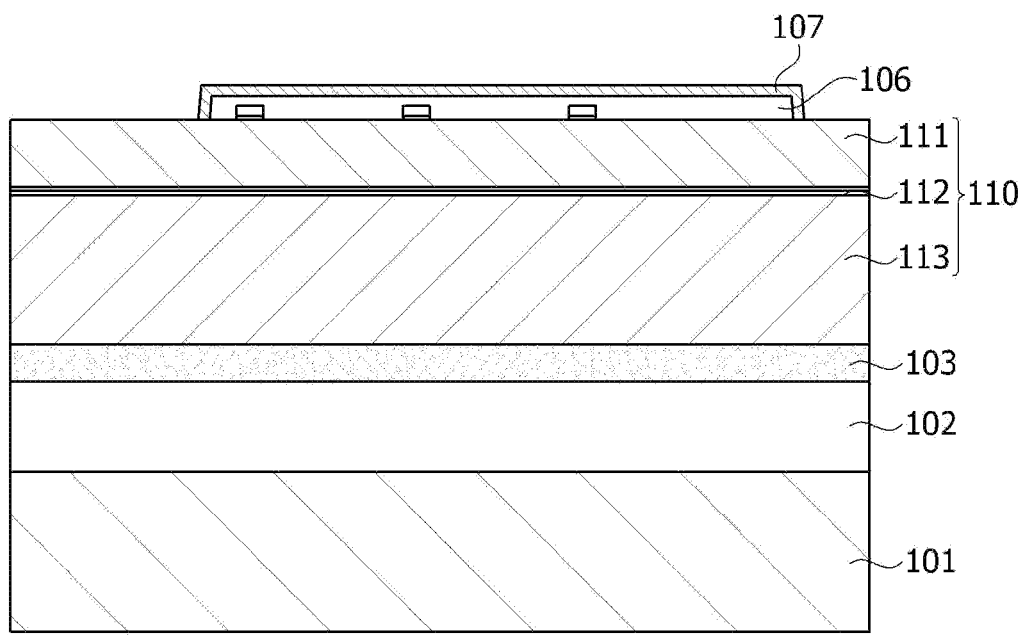
[FIG.10H]
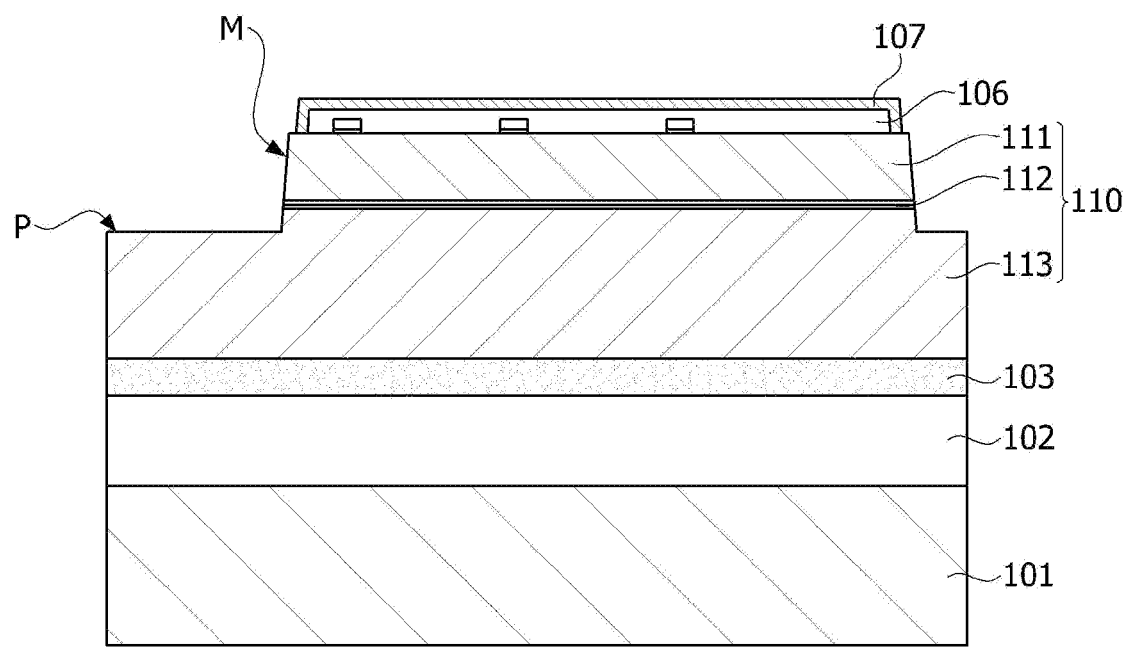

[FIG.10I]
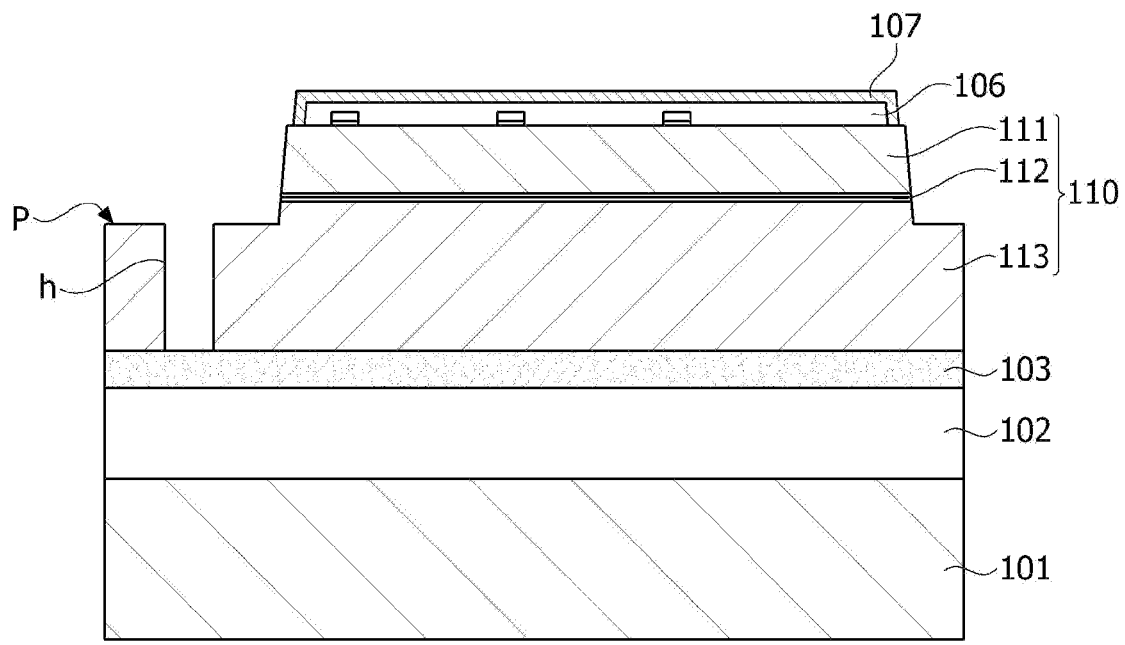
[FIG.10J]
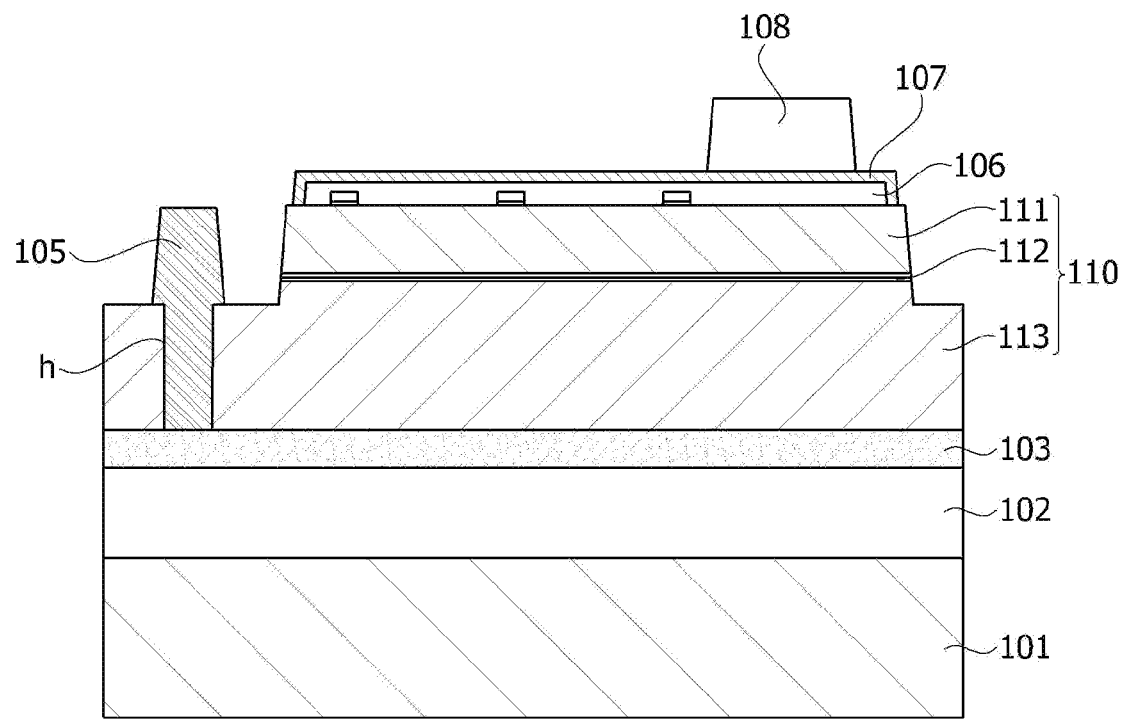

【FIG.10K】
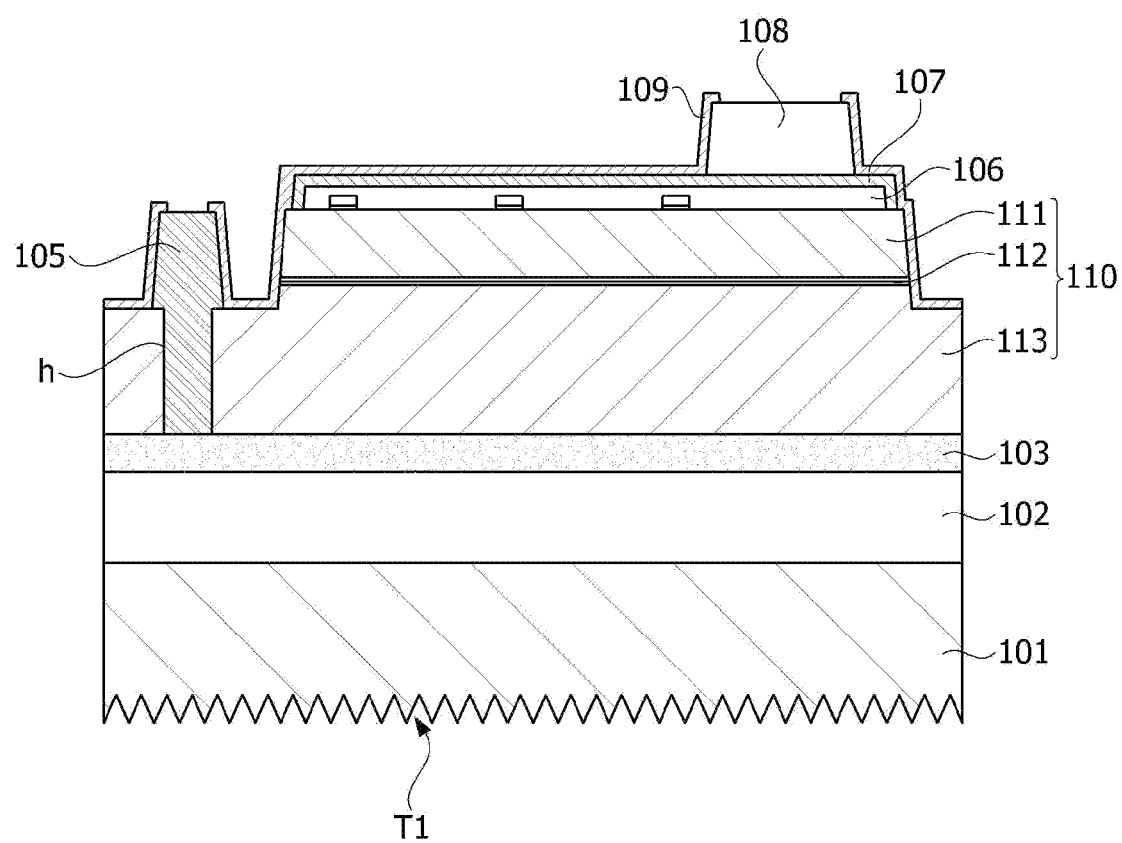

SEMICONDUCTOR DEVICE

CROSS-REFERENCE TO RELATED PATENT APPLICATIONS

This application is a U.S. National Stage Application under 35 U.S.C. § 371 of PCT Application No. PCT/KR2019/007990, filed Jul. 2, 2019, which claims priority to Korean Patent Application No. 10-2018-0080726, filed Jul. 11, 2018, whose entire disclosures are hereby incorporated by reference.

TECHNICAL FIELD

Embodiments relate to a semiconductor device.

BACKGROUND ART

Semiconductor devices including compounds such as GaN, AlGaN, and the like have many advantages such as wide and easily adjustable band gap energy and the like and thus can be variously used for light-emitting devices, light-receiving devices, and various diodes.

In particular, a light-emitting device, such as a light-emitting diode or a laser diode, using a III-V group or II-VI group compound semiconductor material can realize various colors, such as red, green, blue, or ultraviolet rays due to the development of thin-film growth technology and device materials. Also, the light-emitting device can realize efficient white light by using a fluorescent material or combining colors and has the advantages of low power consumption, semi-permanent lifetime, fast response time, safety, and environmental friendliness as compared to existing light sources such as fluorescent lamps and incandescent lamps.

Moreover, due to the development of device materials, when a light-receiving device, such as a photodetector or a solar cell, is fabricated using a III-V group or II-VI group compound semiconductor material, the light-receiving device generates a photocurrent by absorbing light in various wavelength regions, and thus it is possible to use light in various wavelength regions from a gamma-ray region to a radio-wavelength region. In addition, the light-receiving device has the advantages of fast response time, safety, environmental friendliness, and ease of adjustment of device materials and thus may be easily used for power control, or ultra-high frequency circuits or communication modules.

Accordingly, the applications of semiconductor devices are being expanded to transmission modules of optical communication means, light-emitting diode backlights which replace cold cathode fluorescence lamps (CCFLs) constituting backlights of liquid crystal display (LCD) devices, white light-emitting diode lighting devices which may replace fluorescent lamps or incandescent lamps, vehicle headlights, traffic lights, sensors for sensing gas or fire, and the like. In addition, the applications of semiconductor devices may be expanded to high-frequency application circuits, other power control devices, and communication modules.

However, when semiconductor devices are applied for lighting in vehicles or the like, there is a reliability problem due to wires, and thus a flip-chip structure is applied, but in this case, there is a limitation in that light extraction efficiency and electrical characteristics are degraded due to current crowding in a region adjacent to a conductive semiconductor layer and an electrode.

DISCLOSURE

Technical Problem

An embodiment is directed to providing a flip-chip type semiconductor device which emits red light.

An embodiment is also directed to providing a semiconductor device with excellent light extraction efficiency.

An embodiment is also directed to providing a semiconductor device with an excellent current-spreading effect.

An embodiment is also directed to providing a semiconductor device with excellent ohmic contact.

An embodiment is also directed to providing a semiconductor device with improved heat dissipation efficiency.

Objectives to be solved by the embodiment are not limited to the above-described objective and will include objectives and effectiveness which may be identified by solutions for the objectives and the embodiments described below.

Technical Solution

One aspect of the present invention provides a semiconductor device including a substrate, a bonding layer disposed on the substrate, an electrode layer disposed on the bonding layer, a semiconductor structure disposed on the electrode layer and including a first conductive semiconductor layer, a second conductive semiconductor layer, and an active layer disposed between the first conductive semiconductor layer and the second conductive semiconductor layer, a first electrode electrically connected to the first conductive semiconductor layer, and a second electrode electrically connected to the second conductive semiconductor layer, wherein the second conductive semiconductor layer includes a through-hole, and the second electrode is disposed in the through-hole and electrically connected to the electrode layer.

An area ratio of a maximum area of the electrode layer and a maximum area of the second electrode may be in a range of 1:0.002 to 1:0.3.

A thickness ratio of a maximum thickness of the second conductive semiconductor layer and a maximum thickness of the second electrode may be in a range of 1:0.006 to 1:0.25.

The semiconductor device may further include an intermediate layer disposed between the first electrode and the first conductive semiconductor layer.

An area ratio of an area of the intermediate layer and an area of the first conductive semiconductor layer may be in a range of 1:0.02 to 1:0.06.

The doping concentration of the first conductive semiconductor layer may be greater than or equal to 2.0E20 atoms/cm3.

The semiconductor device may further include a reflective layer disposed on the first electrode and the first conductive semiconductor layer and a capping layer disposed on the reflective layer.

The semiconductor structure may include side surfaces including a first surface and a second surface.

The first surface may be an inclined surface to which the first conductive semiconductor layer, the active layer, and the second conductive semiconductor layer are exposed, and the second surface may be an upper surface of the second conductive semiconductor layer, which extends from the first surface toward an edge of the semiconductor structure and is exposed.

The through-hole may be disposed in the second surface.

The through-hole may be disposed to be spaced apart from the active layer and the first conductive semiconductor layer.

Another aspect of the present invention provides a semiconductor device package including a body, a first electrode layer and a second electrode layer disposed at a lower portion of the body, and a semiconductor device disposed in the body and electrically connected to the first electrode layer and the second electrode layer, wherein the semiconductor device includes a substrate, a bonding layer disposed on the substrate, an electrode layer disposed on the bonding layer, a semiconductor structure disposed on the electrode layer and including a first conductive semiconductor layer, a second conductive semiconductor layer, and an active layer disposed between the first conductive semiconductor layer and the second conductive semiconductor layer, a first electrode electrically connected to the first conductive semiconductor layer, and a second electrode electrically connected to the second conductive semiconductor layer, the second conductive semiconductor layer includes a through-hole, and the second electrode is disposed in the through-hole and electrically connected to the first electrode.

Still another aspect of the present invention provides a semiconductor device including a substrate, a bonding layer disposed on the substrate, an electrode layer disposed on the bonding layer, a semiconductor structure disposed on the electrode layer and including a first conductive semiconductor layer, a second conductive semiconductor layer, and an active layer disposed between the first conductive semiconductor layer and the second conductive semiconductor layer, a first electrode electrically connected to the first conductive semiconductor layer, and a second electrode electrically connected to the second conductive semiconductor layer, wherein the second electrode is disposed on the electrode layer.

Advantageous Effects

According to an embodiment, it is possible to implement a semiconductor device, which emits red light, in a flip-chip form.

Further, it is possible to provide a semiconductor device with improved heat dissipation efficiency.

Further, it is possible to manufacture a light-emitting device with excellent light extraction efficiency.

In addition, it is possible to manufacture a semiconductor device with excellent ohmic contact.

Various advantages and effects of the present invention are not limited to the above description and can be more easily understood through the description of specific embodiments of the present invention.

DESCRIPTION OF DRAWINGS

FIG. 1 is a plan view of a semiconductor device according to one embodiment.

FIG. 2 is a cross-sectional view taken along line AA' in the semiconductor device of FIG. 1.

FIG. 3 is an enlarged view of portion B in FIG. 2.

FIGS. 4, 5A, and 5B are plan views for describing the relationship between each element of the semiconductor device.

FIG. 6 is a cross-sectional view of a semiconductor device according to another embodiment.

FIG. 7 is a cross-sectional view of a semiconductor device according to still another embodiment.

FIG. 8 is a view illustrating a modified example of FIG. 2.

FIG. 9 is a cross-sectional view of a semiconductor device package according to one embodiment.

FIGS. 10A to 10K are sequence diagrams for describing a method of manufacturing the semiconductor device according to one embodiment.

MODES OF THE INVENTION

The present invention may be modified in various forms and have various embodiments, and thus particular embodiments thereof will be illustrated in the accompanying drawings and described in the detailed description. It should be understood, however, that there is no intent to limit the present invention to the particular forms disclosed, but on the contrary, the present invention is to cover all modifications, equivalents, and alternatives falling within the spirit and scope of the present invention.

It will be understood that, although the terms "first," "second," and the like may be used herein to describe various elements, these elements should not be limited by these terms. These terms are only used to distinguish one element from another. For example, without departing from the scope of the present invention, a second element could be referred to as a first element, and, similarly, a first element may also be referred to as a second element. The term "and/or" includes a combination of a plurality of related listed items or any one item of the plurality of related listed items.

It should be understood that when an element is referred to as being "connected" or "coupled" to another element, it may be directly connected or coupled to the other element or intervening elements may be present. In contrast, when an element is referred to as being "directly connected," or "directly coupled" to another element, it should be understood that still another element may not be present between the element and another element.

The terms used herein are for the purpose of describing particular embodiments only and are not intended to be limiting to the present invention. It is to be understood that the singular forms include plural forms unless the context clearly dictates otherwise. In the present specification, it will be further understood that the terms "comprise," "comprising," "include," and/or "including" when used in this specification, specify the presence of stated features, integers, steps, operations, elements, components and/or groups thereof, but do not preclude the presence or addition of one or more other features, integers, steps, operations, elements, components and/or groups thereof. Unless otherwise defined, all terms used herein, including technical and scientific terms, have the same meaning as commonly understood by one of ordinary skill in the art to which the present invention belongs.

Terms, such as those defined in commonly used dictionaries, should be interpreted as having a meaning that is consistent with their meaning in the context of the relevant art and will not be interpreted in an idealized or overly formal sense unless clearly defined in the present application. It should be further understood that terms, such as those defined in commonly used dictionaries, should be interpreted as having a meaning that is consistent with their meaning in the context of the relevant art and are not to be interpreted in an idealized or overly formal sense unless expressly so defined herein.

Hereinafter, embodiments of the present invention will be described in detail with reference to the accompanying drawings. Regardless of reference numerals, like numbers refer to like elements throughout the description of the figures, and the description of the same elements will be not reiterated.

Further, hereinafter, a first direction is a thickness direction of a semiconductor structure and refers to an X-axis direction, and a second direction is a direction perpendicular to the first direction and refers to a Y-axis direction. In addition, a third direction refers to a Z-axis direction that is a direction perpendicular to the first direction and the second direction.

FIG. 1 is a plan view of a semiconductor device according to one embodiment, FIG. 2 is a cross-sectional view taken along line AA' in the semiconductor device of FIG. 1, and FIG. 3 is an enlarged view of portion B in FIG. 2.

Referring to FIGS. 1 and 2, a semiconductor device 10 according to the embodiment includes a substrate 101, a bonding layer 102 disposed on the substrate 101, an electrode layer 103 disposed on the bonding layer 102, a semiconductor structure 110 disposed on the electrode layer 103 and including a first conductive semiconductor layer 111, a second conductive semiconductor layer 113, and an active layer 112 disposed between the first conductive semiconductor layer 111 and the second conductive semiconductor layer 113, a first electrode 104 electrically connected to the first conductive semiconductor layer 111, and a second electrode 105 electrically connected to the second conductive semiconductor layer 113.

First, the substrate 101 may be disposed at one side of the semiconductor device 10. For example, the substrate 101 may be disposed at a lower portion of the semiconductor device 10. The substrate 101 may transmit light and may be an insulating substrate 101. The substrate 101 may be made of at least one selected from the group consisting of Al, Si, O, Zn, Mg, Ga, P, and F. Specifically, the substrate 101 may be formed of a material selected from the group consisting of sapphire (Al2O3), SiC, GaN, ZnO, Si, GaP, InP, and Ge, but the material of the substrate 101 is not particularly limited as long as it transmits light generated from the semiconductor structure 110.

A first uneven portion T1 may be formed on a lower portion of the substrate 101, and the first uneven portion T1 may have a texture structure so that light extraction efficiency may be improved. For example, the semiconductor device 10 may be a flip-type semiconductor device so that light may be emitted upward through the substrate 101, and the amount of light emitted from the inside of the semiconductor device 10 to the outside thereof may be increased due to the first uneven portion T1 of the substrate 101. For example, the substrate 101 may be made of a material having a refractive index between 1 and 3.4 in order to minimize total reflection at an interface with the outside. However, the substrate 101 is not limited to such a structure and may have various structures.

The bonding layer 102 may be disposed on the substrate 101. The bonding layer 102 may be made of a material having a light-transmitting property and a bonding property. The bonding layer 102 may include a polymer or oxide structure, may include an oxide such as silicon oxide (SiOx), titanium oxide (TiOx), or tantalum oxide (Ta2O5) or a resin such as polycarbonates (PC) or poly-methyl-methacrylate (PMMA) and may also include optical clear adhesive (OCA) and benzocyclobutene (BCB). However, the present invention is not limited to such a material.

In addition, the bonding layer 102 may be disposed between the second conductive semiconductor layer 113 and the substrate 101 and may have a refractive index between a refractive index of the second conductive semiconductor layer 113 and a refractive index of the substrate 101 to improve light transmission and extraction efficiency. For example, the bonding layer 102 may have a refractive index of 1.2 to 3.5, but this may be changed depending on the materials of the substrate 101 and the second conductive semiconductor layer 113.

The electrode layer 103 may be disposed on the bonding layer 102, and specifically, may be disposed between the bonding layer 102 and the semiconductor structure 110 to be described below.

The electrode layer 103 may be made of a transparent material and thus have a light-transmitting property. In addition, the electrode layer 103 may be made of an electrically conductive material and thus may have conductivity. For example, the electrode layer 103 may include at least one selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, IrOx, RuOx, NiO, Ni/IrOx/Au/ITO, Ag, Ni, Cr, Ti, Al, Rh, Pd, Ir, Sn, In, Ru, Mg, Zn, Pt, Au, and Hf, but the present invention is not limited to such materials. In addition, the electrode layer 103 may be electrically connected to the second electrode 105 disposed in a through-hole h of the second conductive semiconductor layer 113, which will be described below. In addition, the electrode layer 103 may be disposed below the second conductive semiconductor layer 113 and may be in full-surface contact with a lower surface of the second conductive semiconductor layer 113. In addition, the second electrode 105 may not be in ohmic contact with the second conductive semiconductor layer 113, and the electrode layer 103 may be in ohmic contact with the second conductive semiconductor layer 113. Accordingly, a resistance between the second electrode 105 and the second conductive semiconductor layer 113 may be greater than a resistance between the electrode layer 103 and the second conductive semiconductor layer 113. That is, current flows between the electrode layer 103 and the second conductive semiconductor layer 113 so that the semiconductor device 10 may emit light.

Further, due to the electrode layer 103, the second conductive semiconductor layer 113 may have an electrical contact at the entire lower surface instead of a partial electrical contact at a partial region. Thus, the semiconductor device 10 according to the embodiment may prevent electrical contact from being made only in a partial region of the second conductive semiconductor layer 113, thereby preventing current crowding caused by the electrical contact in the partial region. That is, current flows through the entire surface of the second conductive semiconductor layer 113 (portion B1) due to the electrode layer 103 so that current spreading may be improved.

In addition, a cross-sectional area, through which current flows, is increased due to the electrical contact between the electrode layer 103 and the second conductive semiconductor layer 113 so that electrical resistance is reduced as compared to the electrical contact in the partial region, and as the electrical resistance is reduced, the amount of heat generation may be reduced. As a result, the semiconductor device 10 according to the embodiment has improved thermal characteristics by reducing the discharge of heat generated by the resistance, thereby improving reliability. In addition, when red light is emitted, it is possible to prevent optical characteristics from being degraded due to the temperature.

Further, similar to the bonding layer 102, the electrode layer 103 may have a refractive index between the refractive index of the second conductive semiconductor layer 113 and the refractive index of the substrate 101 to improve light transmission and extraction efficiency.

The semiconductor structure 110 may be disposed on the electrode layer 103 and includes the first conductive semiconductor layer 111, the active layer 112, and the second conductive semiconductor layer 113.

The first conductive semiconductor layer 111 may be implemented with a III-V group or II-VI group compound semiconductor and may be doped with a first dopant. The first conductive semiconductor layer 111 may be made of semiconductor materials having a composition formula of $In_{x1}Al_{y1}Ga_{1-x1-y1}N$ ($0<=x1<=1$, $0<y1<=1$, and $0<=x1+y1<=1$), for example, semiconductor materials selected from among AlGaN, AlN, InAlGaN, and the like. In addition, the first dopant may be an n-type dopant such as Si, Ge, Sn, Se, or Te. When the first dopant is an n-type dopant, the first conductive semiconductor layer 111 doped with the first dopant may be an n-type semiconductor layer. However, the present invention is not limited thereto, and the first conductive semiconductor layer 111 may be a p-type semiconductor layer.

The active layer 112 may be disposed between the first conductive semiconductor layer 111 and the second conductive semiconductor layer 113. The active layer 112 may include a plurality of well layers (not shown) and a plurality of barrier layers (not shown). The well layer (not shown) is a layer in which first carriers (electrons or holes) injected through the first conductive semiconductor layer 111 are combined with second carriers (holes or electrons) injected through the second conductive semiconductor layer 113. When first carriers (or second carriers) in a conduction band and second carriers (or first carriers) in a valence band are recombined in the well layer (not shown) of the active layer 112, light having a wavelength corresponding to a difference in energy level (an energy band gap) between the conduction band and the valence band of the well layer (not shown) may be generated.

The active layer 112 may have one structure among a single well structure, a multi-well structure, a single quantum well structure, a multi-quantum well (MQW) structure, a quantum dot structure, and a quantum wire structure, but the structure of the active layer 112 is not limited thereto.

The active layer 112 may include a plurality of well layers (not shown) and a plurality of barrier layers (not shown). Each of the well layers (not shown) and the barrier layers (not shown) may have a composition formula of $In_{x2}Al_{y2}Ga_{1-x2-y2}N$ ($0<=x2<=1$, $0<y2<=1$, and $0<=x2+y2<=1$). An aluminum composition in the well layer (not shown) may vary according to a wavelength of emitted light.

The second conductive semiconductor layer 113 may be formed on the active layer 112 and implemented with a III-V group or II-VI group compound semiconductor, and the second conductive semiconductor layer 113 may be doped with a second dopant.

The second conductive semiconductor layer 113 may be made of semiconductor materials having a composition formula of $In_{x5}Al_{y2}Ga_{1-x5-y2}N$ ($0<=x5<=1$, $0<y2<=1$, and $0<=x5+y2<=1$) or materials selected from among AlInN, AlGaAs, GaP, GaAs, GaAsP, and AlGaInP.

When the second dopant is a p-type dopant such as Mg, Zn, Ca, Sr, Ba, or the like, the second conductive semiconductor layer 113 doped with the second dopant may be a p-type semiconductor layer. However, the present invention is not limited thereto, and the second conductive semiconductor layer 113 may be an n-type semiconductor layer.

Further, since the semiconductor device 10 has a flip-type structure as described above, the second conductive semiconductor layer 113 may be disposed to be more adjacent to the substrate 101 than the first conductive semiconductor layer 111.

Further, a second uneven portion T2 may be formed on a lower portion of the second conductive semiconductor layer 113. The second uneven portion T2 may have a texture structure so that the light extraction efficiency may be improved. The texture structure may have various shapes of a plurality of patterns with various thicknesses and widths, and the plurality of patterns may have the same thickness and width. With such a configuration, in the semiconductor device 10 according to the embodiment, operating voltage may be improved, and yield may be improved. In addition, the texture structure may include a superlattice structure, but the present invention is not limited thereto. In addition, the texture structure is not limited to the above-described shape, thickness, and width.

Thus, the semiconductor device 10 according to the embodiment may emit light through the second conductive semiconductor layer 113 and the substrate 101 and increase the amount of light emitted to the outside of the semiconductor device 10 from the inside thereof due to the second uneven portion T2 of the second conductive semiconductor layer 113. However, the second conductive semiconductor layer 113 is not limited to such a structure and may have various structures.

First, the semiconductor structure 110 may be formed in a structure passing through the first conductive semiconductor layer 111 and the active layer 112 and passing through even a partial region of the second conductive semiconductor layer 113. That is, the semiconductor structure 110 may have a first surface M, which is an inclined surface to which the first conductive semiconductor layer 111, the active layer 112, and the second conductive semiconductor layer 113 are exposed, and a second surface P, which is an upper surface of the second conductive semiconductor layer 113 exposed due to the structure passing through a partial region of the second conductive semiconductor layer 113. In addition, the second surface P is a surface extending toward an edge of the semiconductor structure 110 from the first surface M. The second surface P may be connected to the first surface M, and the first surface M may be disposed between the second surface P and an upper surface of the first conductive semiconductor layer 111. The first surface M and the second surface P may be partial surfaces of side surfaces of the semiconductor structure 110.

In addition, as described above, the second conductive semiconductor layer 113 may include the through-hole h, and the through-hole h may be disposed in the second surface P. The second electrode 105 may be disposed in the through-hole h. Thus, the second electrode 105 may be electrically connected to the electrode layer 103 below the second conductive semiconductor layer 113. Further, the second electrode 105 is disposed on the second surface P to be spaced apart from the active layer 112 and the first conductive semiconductor layer 111 of the first surface M and thus may be prevented from being electrically connected to the active layer 112 and the first conductive semiconductor layer 111.

Referring to FIG. 3, in the semiconductor device 10 according to the embodiment, current spreading may be improved by making the second conductive semiconductor layer 113 be in full-surface contact with the electrode layer 103 therebelow so that it is possible to reduce the maximum height of the second conductive semiconductor layer 113. Thus, it is possible to miniaturize the semiconductor device 10.

In other words, in the semiconductor device 10 according to the embodiment, since the second conductive semiconductor layer 113 is disposed in a lower portion and in full-surface contact with the electrode layer 103, current spreading is ensured so that a maximum thickness of the second conductive semiconductor layer 113 may be reduced as compared to a maximum thickness of the semiconductor structure 110, and thus the semiconductor device 10 may be miniaturized. In addition, since the amount of light absorbed by the second conductive semiconductor layer 113 is reduced due to the reduction of the maximum thickness of the second conductive semiconductor layer 113, the light extraction efficiency of the semiconductor device may be improved. Further, a maximum thickness h3 of the semiconductor structure 110 may be in a range of 8 µm to 18 µm. In addition, a maximum thickness h1 of the second conductive semiconductor layer 113 may be in a range of 1 µm to 4 µm. Here, when the maximum thickness h1 of the second conductive semiconductor layer 113 is less than 1 µm, there is a problem in that the operating voltage is increased due to the reduction of the current spreading. In addition, when the maximum thickness h1 of the second conductive semiconductor layer 113 is greater than 4 µm, there is a problem in that light is absorbed by the second conductive semiconductor layer 113 and thus light output of the semiconductor device is reduced.

Further, a thickness ratio of the maximum thickness h1 of the second conductive semiconductor layer 113 and the maximum thickness h3 of the semiconductor structure 110 may be in a range of 1:2 to 1:18. When the thickness ratio is less than 1:2, the thickness of the second conductive semiconductor layer 113 is relatively increased as compared to the thickness of the semiconductor structure 110 to increase the through-hole h and a current path of the second electrode 105 disposed inside the through-hole h, and thus there is a problem in that electrical characteristics are degraded. In addition, when the thickness ratio is greater than 1:18, the thickness of the second conductive semiconductor layer 113 is relatively reduced as compared to the thickness of the semiconductor structure 110, and thus there is a limitation in that a process becomes difficult, and there is a problem in that an electrical short occurs since a distance between the second electrode 105 and the first conductive semiconductor layer 111 is decreased.

Further, a thickness ratio of the maximum thickness h1 of the second conductive semiconductor layer 113 and a maximum thickness h2 of the second electrode 105 may be in a range of 1:0.006 to 1:0.25. When the thickness ratio is less than 1:0.006, the current provided to the second conductive semiconductor layer 113 through the second electrode 105 is reduced, and thus there is a limitation in that the light extraction efficiency is degraded and the second electrode 105 is difficult to form. In addition, when the thickness ratio is greater than 1:0.25, the size is increased and the current path is increased, and thus there are problems in that the resistance is increased, the light extraction efficiency is degraded, and the amount of heat generation is increased.

In addition, the second conductive semiconductor layer 113 may have a doping concentration of 2.0E20 atoms/cm3 or more in a region adjacent to the electrode layer 103. With such a configuration, the second conductive semiconductor layer 113 is easily in contact with the electrode layer 103 so as to improve the electrical characteristics.

Further, the second conductive semiconductor layer 113 may be divided into a plurality of layers. For example, the second conductive semiconductor layer 113 may include a first sub semiconductor layer 113a and a second sub semiconductor layer 113b. Hereinafter, descriptions will be made on the basis of the above description.

First, the first sub semiconductor layer 113a may be disposed between the electrode layer 103 and the second sub semiconductor layer 113b and in contact with the electrode layer 103.

In addition, the first sub semiconductor layer 113a may have a doping concentration higher than that of the second sub semiconductor layer 113b, and as described above, the first sub semiconductor layer 113a may have a doping concentration of 2.0E20 atoms/cm3 or more. Thus, the first sub semiconductor layer 113a may easily be in electrical contact with the electrode layer 103 therebelow, and the spreading of the current to the first sub semiconductor layer 113a through the electrode layer 103 may be improved.

Further, the first sub semiconductor layer 113a may have a thickness h11 of 10 nm to 200 nm.

The second sub semiconductor layer 113b is disposed between the first sub semiconductor layer 113a and the active layer 112, and the doping concentration thereof may be reduced toward the active layer 112. Accordingly, crystallinity of the second sub semiconductor layer 113b may be improved.

Further, a thickness ratio of the thickness h11 of the first sub semiconductor layer 113a and a thickness h12 of the second sub semiconductor layer 113b may be in a range of 1:4 to 1:400. When the thickness ratio is less than 1:4, light is absorbed by the first sub semiconductor layer 113a, and thus there is a problem in that the light output is reduced. In addition, when the thickness ratio is less than 1:400, the first sub semiconductor layer 113a does not make good contact with the electrode layer 103, and thus there is a limitation in that the current spreading in the second conductive semiconductor layer 113 is reduced to degrade the electrical characteristics. A portion of the second electrode 105 may be disposed in the through-hole h and another portion thereof may be disposed on the second conductive semiconductor layer 113. The second electrode 105 may include a conductive material. For example, the second electrode 105 may be made of any one selected from among Ti, Ru, Rh, Ir, Mg, Zn, Al, In, Ta, Pd, Co, Ni, Si, Ge, Ag, and Au. However, the present invention is not limited to such a material.

The first electrode 104 may be disposed on the first conductive semiconductor layer 111 and may be electrically connected to the first conductive semiconductor layer 111. The first electrode 104 may be made of any one selected from among Ti, Ru, Rh, Ir, Mg, Zn, Al, In, Ta, Pd, Co, Ni, Si, Ge, Ag, and Au. However, the present invention is not limited to such a material.

An intermediate layer 121 for electrical contact may be formed between the first electrode 104 and the first conductive semiconductor layer 111. The intermediate layer 121 may include n-GaAs, but is not limited to such a material and may be made of any material capable of providing contact between the first conductive semiconductor layer 111 and the first electrode 104.

In addition, the intermediate layer 121 may be partially disposed on the upper surface of the first conductive semiconductor layer 111. Thus, the intermediate layer 121 may absorb light generated by the active layer 112 to a minimum extent while allowing the connection between the first electrode 104 and the first conductive semiconductor layer 111 to be made, and thus it is possible to increase the amount of light emitted to the outside by a reflective layer 106 to be described below.

The reflective layer 106 may be disposed on the first electrode 104, the intermediate layer 121, and the upper surface of the first conductive semiconductor layer 111. Specifically, the reflective layer 106 may be disposed to surround the first electrode 104 and the intermediate layer 121 and may be electrically connected to the first electrode 104.

The reflective layer 106 may be made of a material having high reflectivity. For example, the reflective layer 106 may include at least one among Ag, Ni, Al, Rh, Pd, Ir, Ru, Mg, Zn, Pt, Au, and Hf, but the present invention is not limited to such a material.

A capping layer 107 may be disposed on the reflective layer 106 and the first conductive semiconductor layer 111. Specifically, the capping layer 107 may be disposed to surround the reflective layer 106 and be electrically connected to the reflective layer 106. In addition, the capping layer 107 may be partially disposed on the upper surface of the first conductive semiconductor layer 111 and may be electrically separated from the second conductive semiconductor layer 113.

The capping layer 107 may be made of a conductive material and may include at least one among Ti, Au, Sn, Ni, Cr, Ga, In, Bi, Cu, Ag, and Ta. However, the present invention is not limited to such a material.

In addition, a first pad electrode 108 may be disposed in a partial region on the capping layer 107 and may be electrically connected to the capping layer 107. The first pad electrode 108 may be made of a conductive material. For example, the first pad electrode 108 may include at least one among Ag, Ni, Cr, Ti, Al, Rh, Pd, Ir, Sn, In, Ru, Mg, Zn, Pt, Au, and Hf. However, the present invention is not limited to such a material.

An insulating layer 109 may be disposed on an upper surface of the semiconductor device 10 and may protect the semiconductor device 10 from the outside. The insulating layer 109 may include at least one among SiO2, SiOx, SiOxNy, Si3N4, Al2O3, and TiO2, but the present invention is not limited to such a material.

The insulating layer 109 may not be disposed on a portion of an upper surface of each of the electrode layer 103 and the first electrode pad 108. With such a configuration, partial regions of the first electrode pad 108 and the electrode layer 103 may be exposed to the outside. In addition, through the exposed surface, the first electrode pad 108 and the second electrode 105 may be electrically connected to an external electrode or the like by bonding or the like.

FIGS. 4, 5A, and 5B are plan views for describing the relationship between each element of the semiconductor device.

Referring to FIG. 4, the second electrode 105 may include a second-first electrode (not shown) and a second-second electrode (not shown). The second-first electrode may be disposed in the through-hole h, and on the through-hole h, the second-second electrode may be disposed on the second-first electrode and on a portion of the second surface P of the second conductive semiconductor layer 113. The second-second electrode may extend in the second direction and the third direction from the second-first electrode. For example, the second-second electrode may extend in the second direction and the third direction on the second-first electrode. Thus, the maximum area of the second-second electrode may be greater than the maximum area of the second-first electrode.

In the second electrode 105, a width W1 in the second direction and a length L1 in the third direction may be different from each other. For example, in the second electrode 105, the width W1 in the second direction may be less than the length L1 in the third direction. In addition, the first electrode 104 may be disposed in the second direction with respect to the second electrode 105. However, the width and length of the second electrode 105 may be changed depending on the arrangement direction of the semiconductor device 10 and the position relationship of the first electrode 104 and the second electrode 105. Hereinafter, descriptions will be made on the basis of the above description.

Specifically, the second electrode 105 may have a maximum width W1 of 1 µm to 150 µm so as to be in contact with the electrode layer 103. Preferably, the second electrode 105 may have a maximum width W1 of 60 µm to 100 µm in consideration of a process such as a bonding process at an upper portion thereof. However, the present invention is not limited to such a value.

In addition, a width ratio of the maximum width W1 of the second electrode 105 and a maximum width W2 of the semiconductor device 10 may be in a range of 1:3.3 to 1:50. When the width ratio is less than 1:3.3, the area of the active layer 112 decreases according to the ratio occupied by the second electrode 105, and thus there is a limitation in that luminous flux decreases. In addition, when the width ratio is greater than 1:50, the contact area between the second electrode 105 and the electrode layer 103 is reduced, and thus there is a limitation in that current spreading is reduced due to the degradation of the electrical characteristics.

Further, a length ratio of a maximum length L1 of the second electrode 105 and the maximum length L2 (or width) of the semiconductor device 10 may be in a range of 1:1.01 to 1:1.1. When the length ratio is less than 1:1.01, there is a limitation in that manufacturing in a dicing process is difficult, and when the length ratio is greater than 1:1.1, there is a problem in that light efficiency is lowered with respect to the size of the semiconductor device 10.

Referring to FIG. 5A, in the semiconductor device 10 according to the embodiment, an area ratio of an area S2 of the semiconductor device 10 (here, the area of the semiconductor device 10 is the same as the area of the electrode layer 103) and an area S1 of the second electrode 105 in the through-hole h may be in a range of 1:0.002 to 1:0.3.

When the area ratio is less than 1:0.002, a contact region between the second electrode 105 and the electrode layer 103 is reduced such as to cause defects in electrical characteristics, and thus there is a process problem in that the contact region is difficult to form during die bonding. In addition, when the area ratio is greater than 1:0.3, there is a limitation in that a luminous flux loss is generated by the second electrode 105.

Further, in the semiconductor device 10 according to the embodiment, an area ratio of an area S3 of the first conductive semiconductor layer 111 and an area S4 of the intermediate layer 121 may be in a range of 1:0.02 to 1:0.06. Here, the area of the first conductive semiconductor layer 111 refers to a maximum area of a lower surface of the first conductive semiconductor layer 111, and the area of the intermediate layer 121 refers to an area of a lower surface of the intermediate layer 121 which is in contact with the first conductive semiconductor layer 111.

When the area ratio is less than 1:0.02, there is a problem in that electrical characteristics are degraded, such as an increase in operating voltage, due to a decrease in the contact region. In addition, when the area ratio is greater than 1:0.06, there is a problem in that light is absorbed by the intermediate layer 121 and thus light extraction is reduced.

Referring to FIG. 5B, FIG. 5B is a modified example of FIG. 4, and the second electrode 105 may be disposed at various positions in the semiconductor device while satisfying the area ratio described in FIG. 5A.

For example, the semiconductor device may include first to fourth surfaces M1 to M4. In addition, the first surface M1 and the second surface M2 are positioned to face each other, and the third surface M3 and the fourth surface M4 are also positioned to face each other.

Here, the second electrode 105 may have a reduced length L1 as compared to the case in FIG. 4 and may be disposed adjacent to a corner E1 at which the first surface M1 is in contact with the third surface M3. However, the present invention is not limited to such a position, and the second electrode 105 may be disposed adjacent to a corner at which the first surface M1 is in contact with the fourth surface M4, a corner at which the second surface M2 is in contact with the fourth surface M4, or a corner at which the second surface M2 is in contact with the third surface M3 within the above-described area ratio of the second electrode 105 and the semiconductor device. In addition, the position of the second electrode 105 may be variously changed depending on the shape of the semiconductor device.

FIG. 6 is a cross-sectional view of a semiconductor device according to another embodiment.

Referring to FIG. 6, a semiconductor device 10a according to another embodiment may include a substrate 101, a bonding layer 102, an electrode layer 103, a semiconductor structure 110, a first electrode 104, an intermediate layer 121, a reflective layer 106, a capping layer 107, an insulating layer 109, a first electrode pad 108, and a second electrode 105. In addition, the above descriptions may be equally applied to other elements except for the second electrode 105.

Further, in the semiconductor device 10a according to another embodiment, the second electrode 105 may include a first sub-electrode and a second sub-electrode. The first sub-electrode may be disposed at an upper portion of the second electrode 105 and may be surrounded by the insulating layer 109 except for a partial region thereof.

The first sub-electrode may be disposed to be spaced apart from the second conductive semiconductor layer 113 and thus may not be in contact with the second conductive semiconductor layer 113.

The second sub-electrode is disposed below the first sub-electrode and may be disposed in a through-hole h. Specifically, the second sub-electrode may extend toward the through-hole h from the first sub-electrode. In addition, the second sub-electrode may be partially in contact with a second surface P of the second conductive semiconductor layer 113 and may be in ohmic contact with the second conductive semiconductor layer 113. As a result, current may be injected into the second conductive semiconductor layer 113 not only through the electrode layer 103 (B1) due to the ohmic contact between the electrode layer 103 and the second conductive semiconductor layer 113 but also through the second sub-electrode (B2) so that current spreading may be further improved. In addition, the thickness of the second conductive semiconductor layer 113 may be reduced by improving the current spreading so that the semiconductor device 10 may be more easily miniaturized. Further, the closer a region (region K) of the active layer 112 is to the second electrode 105, the further current is injected into the second conductive semiconductor layer 113 through not only the electrode layer 103 but also the second sub-electrode so that light extraction may be improved. That is, due to the arrangement of the second electrode 105, the light output, which is reduced by as much as the region from which the active layer 112 is reduced, may be compensated for.

FIG. 7 is a cross-sectional view of a semiconductor device according to still another embodiment.

Referring to FIG. 7, a semiconductor device 10b according to still another embodiment may include a substrate 101, a bonding layer 102, an electrode layer 103, a semiconductor structure 110, a first electrode 104, an intermediate layer 121, a reflective layer 106, a capping layer 107, an insulating layer 109, a first electrode pad 108, and a second electrode 105. In addition, the above descriptions may be equally applied to other elements except for the second electrode 105 and the electrode layer 103.

In the semiconductor device 10b according to still another embodiment, the second electrode 105 may be disposed in a through-hole h and may also be disposed in a groove of the electrode layer 103. Specifically, the electrode layer 103 includes a groove hd, and the electrode layer 103 may include an upper surface 103a, inclined surfaces 103b, and a lower surface 103c due to the groove hd. In this case, the upper surface 103a may be a surface of the electrode layer 103, which is in contact with a second conductive semiconductor layer 113, the inclined surfaces 103b may be surfaces extending downward from the upper surface 103a, and the lower surface 103c may be disposed between the inclined surfaces 103b and may be a portion of an upper surface of the electrode layer 103 located at a lowermost side among the upper surface thereof.

In addition, the second electrode 105 may be disposed in the groove hd of the electrode layer 103. That is, the second electrode 105 may be in contact with the inclined surfaces 103b and the lower surface 103c. Thus, even though the area of the through-hole h is small, the contact area between the second electrode 105 and the electrode layer 103 may be increased. That is, even when the area of the through-hole h is reduced, current injection due to the contact may be maintained, thereby improving light extraction efficiency.

FIG. 8 is a view illustrating a modified example of FIG. 2.

Referring to FIG. 8, a semiconductor device 10c according to the modified example may include a substrate 101, a bonding layer 102, an electrode layer 103, a semiconductor structure 110, a first electrode 104, an intermediate layer 121, a reflective layer 106, a capping layer 107, an insulating layer 109, a first electrode pad 108, and a second electrode 105. In addition, the above descriptions may be equally applied to other elements except for the second electrode 105, the second conductive semiconductor layer 113, and the insulating layer 109.

In the semiconductor device 10c according to the modified example, a partial region of the second conductive semiconductor layer 113 may be removed to expose the electrode layer 103. In addition, an active layer 112 and a first conductive semiconductor layer 111 may be removed in a region at which the second conductive semiconductor layer 113 is not present. That is, the semiconductor structure 110 may be disposed in a partial region on the electrode layer 103.

In addition, the second electrode 105 may be disposed on the electrode layer 103. Further, the second electrode 105 may be located below the active layer 112. In addition, the second electrode 105 is in contact with the electrode layer 103 and is not in contact with the second conductive semiconductor layer 113. Accordingly, the second conductive semiconductor layer 113 has a current flowing therethrough due to the contact with the electrode layer 103 so that current crowding may be further prevented.

Further, since a thickness of the second electrode 105 is reduced, an electrical resistance due to the thickness of the second electrode 105 may be reduced, and thus luminous flux may be improved.

Further, a portion of the insulating layer 109 may be in contact with the electrode layer 103.

FIG. 9 is a cross-sectional view of a semiconductor device package according to one embodiment.

Referring to FIG. 9, a semiconductor device package 200 according to the embodiment may include a body 205, a first electrode layer 211 and a second electrode layer 212 installed in the body 205, a semiconductor device 10 installed in the body 205 and electrically connected to the first electrode layer 211 and the second electrode layer 212, and a molding member 220 including a phosphor (not shown) and surrounding the semiconductor device 10.

The first electrode layer 211 and the second electrode layer 212 are electrically separated from each other and serve to provide power to the semiconductor device 10. In addition, the first electrode layer 211 and the second electrode layer 212 may serve to increase light efficiency by reflecting light generated by the semiconductor device 10 and may also serve to discharge heat generated by the semiconductor device 10 to the outside.

The semiconductor device according to the third embodiment is exemplified as the semiconductor device 10, but the present invention is not limited thereto, and the light-emitting devices according to other embodiments are also applicable.

A light-emitting device according to the embodiment is applicable to a backlight unit, a lighting unit, a display device, an indicating device, a lamp, a street light, a vehicle lighting device, a vehicle display device, a smart watch, and the like, but the present invention is not limited thereto.

FIGS. 10A to 10K are sequence diagrams for describing a method of manufacturing the semiconductor device according to one embodiment.

Referring to FIG. 10A, an intermediate layer 121 may be disposed on a donor substrate 1, a semiconductor structure 110 may be disposed on the intermediate layer 121, and an electrode layer 103 may be disposed on the semiconductor structure 110.

The donor substrate 1 may include at least one among GaAs, sapphire (Al2O3), SiC, Si, GaN, ZnO, GaP, InP, Ge, and Ga2O3. For example, in order to fabricate a semiconductor device 10 generating red light, the donor substrate 1 may include GaAs.

The intermediate layer 121 may be disposed on the donor substrate 1. The donor substrate 1 may include n-GaAs as described above, but the present invention is not limited to such a material. The intermediate layer 121 may be disposed to allow a first electrode 104 to be in contact with a first conductive semiconductor layer 111.

The semiconductor structure 110 may be disposed on the intermediate layer 121. The intermediate layer 121 and the semiconductor structure 110 may be formed using a chemical vapor deposition (CVD) method, a molecular beam epitaxy (MBE) method, a sputtering method, a hydride vapor phase epitaxy (HVPE) method, or the like, but the present invention is not limited thereto.

The semiconductor structure 110 may include the first conductive semiconductor layer 111, an active layer 112, and a second conductive semiconductor layer 113. Specifically, the first conductive semiconductor layer 111 may be disposed on the intermediate layer 121, and the active layer 112 and the second conductive semiconductor layer 113 may be sequentially stacked on the first conductive semiconductor layer 111.

The electrode layer 103 may be disposed on the semiconductor structure 110. The electrode layer 103 may be in contact with the second conductive semiconductor layer 113 as described above and may be disposed on an upper surface of the second conductive semiconductor layer 113 so as to be in full-surface contact with the upper surface of the second conductive semiconductor layer 113.

Referring to FIGS. 10B and 10C, a substrate 101 and the electrode layer 103 may be bonded through the bonding layer 102, and the donor substrate 1 may be removed. First, the substrate 101 may be disposed in a lower portion. As described above, the substrate 101 may be made of a light-transmitting material.

In addition, the bonding layer 102 may be disposed on the substrate 101. Like the substrate 101, the bonding layer 102 may also include a light-transmitting material, and the lower substrate 101 and the upper electrode layer 103 may be bonded to each other.

Further, the donor substrate 1 on the intermediate layer 121 may be removed by physical and/or chemical removal methods. For example, the physical removal method may use a laser lift off (LLO) method in which the temporary substrate 1 is removed by irradiating the temporary substrate 1 with a laser of a predetermined wavelength. In addition, in the chemical removal method, the temporary substrate 1 may be removed by injecting a wet etching solution into a space of a predetermined semiconductor layer (e.g., a buffer layer) on the temporary substrate 1. However, the present invention is not limited to such a method. For example, the donor substrate 1 may be separated from the semiconductor device 10 through an ion layer by plasma.

Here, a process of transferring the semiconductor structure 110 and the electrode layer 103 onto the donor substrate 1 and the bonding layer 102 is applicable to a semiconductor device in which the active layer 112 emits light of which a peak wavelength is in a red wavelength band. In contrast, the semiconductor device that emits light of blue color or the like may be manufactured without the above-described process.

Referring to FIG. 10D, the intermediate layer 121 may be removed to be present in a partial region on the first conductive semiconductor layer 111. For example, the intermediate layer 121 may be removed by dry or wet etching. Further, as described above, the intermediate layer 121 present in the partial region may be formed in consideration of an area ratio between the intermediate layer 121 and the active layer 112 remaining in FIG. 10H.

Referring to FIG. 10E, the first electrode 104 may be formed on the intermediate layer 121. The first electrode 104 may be formed using an e-beam evaporation method, a thermal evaporation method, a metal-organic chemical vapor deposition (MOCVD) method, a sputtering method, and a pulsed laser deposition (PLD) method, but the present invention is not limited thereto.

Referring to FIG. 10F, a reflective layer 106 may be formed on the first conductive semiconductor layer 111. The reflective layer 106 may be formed on a partial region of the first conductive semiconductor layer 111 to surround the intermediate layer 121 and the first electrode 104. In addition, as described above, the reflective layer 106 may be made of a conductive material and may be electrically connected to the first electrode 104.

Referring to FIG. 10G, a capping layer 107 may be formed on the reflective layer 106. In addition, the capping layer 107 may be formed on a partial region of the first conductive semiconductor layer 111 to surround the capping layer 107. In addition, as described above, the capping layer 107 may be made of a conductive material and may be electrically connected to the capping layer 107.

Referring to FIG. 10H, the semiconductor structure 110 may be etched in a structure passing through the first conductive semiconductor layer 111 and the active layer 112 and exposing even a partial region of the second conductive semiconductor layer 113. Thus, the semiconductor structure 110 may have the first surface M and the second surface P described above. Further, the etching may be wet-etching or dry-etching, but the present invention is not limited thereto.

Referring to FIG. 10I, a through-hole h may be formed in the second conductive semiconductor layer 113. The through-hole h may be located on the second surface P. In addition, the electrode layer 103 below the through-hole H may be exposed by the through-hole H. The through-hole h may be formed by wet-etching or dry-etching, but the present invention is not limited thereto.

Further, the through-hole h may be formed by the same etching method or another etching method as used when etching the semiconductor structure 110 described with reference to FIG. 10H.

Referring to FIG. 10J, a second electrode 105 may be formed in the through-hole h. The second electrode 105 may be disposed in the through-hole h and in contact with the electrode layer 103 and the second conductive semiconductor layer 113. In addition, the second electrode 105 may also be disposed on a partial region of the second surface P and may extend upward. With such a configuration, the second electrode 105 may be electrically connected to an external pad.

Further, the second electrode 105 may be formed using an e-beam evaporation method, a thermal evaporation method, an MOCVD method, a sputtering method, and a PLD method, but the present invention is not limited thereto.

Further, a first electrode pad 108 may be formed on the capping layer 107. The arrangement order of the second electrode 105 and the first electrode pad 108 may vary.

Referring to FIG. 10K, an insulating layer 109 may be formed on an upper surface of the semiconductor device 10 and may not be disposed on a portion of an upper surface of the second electrode 105 and a portion of an upper surface of the first electrode pad 108. Thus, the portion of the upper surface of the second electrode 105 and the portion of the upper surface of the first electrode pad 108 may be exposed and may be electrically connected to the outside by various methods.

The semiconductor device may be used as a light source of a lighting system, a light source of an image display device, or a light source of a lighting device. That is, the semiconductor device may be disposed in a case and applied to various electronic devices configured to provide light. As an example, when the semiconductor device is mixed with a red-green-blue (RGB) phosphor and used, white light with a high color rendering index (CRI) may be implemented.

The above-described semiconductor device may be configured as a light-emitting device package and used as a light source of a lighting system. For example, the semiconductor device may be used as a light source of an image display device or a light source of a lighting device.

When the semiconductor device is used as a backlight unit of an image display device, the semiconductor device may be used as an edge-type backlight unit or a direct-type backlight unit. When the semiconductor device is used as a light source of a lighting device, the semiconductor device may be used as a lighting device or a bulb-type lighting device. Alternatively, the semiconductor device may be used as a light source of a mobile terminal.

The light-emitting device includes a laser diode in addition to the above-described light-emitting diode.

Like the light-emitting device, the laser diode may include a first conductive semiconductor layer, an active layer, and a second conductive semiconductor layer that have the above-described structures. In addition, the laser diode may utilize an electroluminescence phenomenon in which light is emitted when current flows after bonding a p-type first conductive semiconductor and an n-type second conductive semiconductor but has a difference in the directionality and phase of the emitted light. That is, the laser diode uses stimulated emission and constructive interference phenomena so that light having a specific single wavelength (monochromatic beam) may be emitted at the same phase and in the same direction. Due to these characteristics, the laser diode may be used for optical communication or medical equipment, semiconductor processing equipment, or the like.

A light-receiving device may include, for example, a photodetector, which is a kind of transducer configured to detect light and convert the intensity of the light into an electric signal. Such a photodetector includes a photocell (silicon or selenium), a photoconductor element (cadmium sulfide or cadmium selenide), a photodiode (PD) (for example, a PD having a peak wavelength in a visible blind spectral region or a true blind spectral region), a phototransistor, a photomultiplier tube, a phototube (vacuum or gas-filled), an infra-red (IR) detector, and the like, but the embodiment is not limited thereto.

Further, the semiconductor device, such as the photodetector, may generally be manufactured using a direct bandgap semiconductor having a high photoconversion efficiency. Alternatively, the photodetector has various structures and the most common structure may include a pin-type photodetector using a p-n junction, a Schottky-type photodetector using a Schottky junction, a metal-semiconductor-metal (MSM)-type photodetector, or the like.

Like the light-emitting device, the photodiode may include a first conductive semiconductor layer, an active layer, and a second conductive semiconductor layer that have the above-described structures and may be formed as a p-n junction or pin structure. The photodiode operates when a reverse bias or a zero bias is applied, and when light is incident on the photodiode, electrons and holes are generated such that current flows. In this case, the magnitude of current may be approximately proportional to the intensity of light incident on the photodiode.

A photocell or solar cell, which is a kind of photodiode, may convert light into current. Like the light-emitting device, the solar cell may include a first conductive semiconductor layer, an active layer, and a second conductive semiconductor layer that have the above-described structures.

Further, the solar cell may be used as a rectifier of an electronic circuit through the rectification characteristics of a general diode using a p-n junction, and may be applied to an ultra-high frequency circuit and then may be applied to an oscillation circuit or the like.

Further, the above-described semiconductor device is not necessarily implemented only with semiconductors and may further include a metal material in some cases. For example, the semiconductor device such as a light-receiving device may be implemented using at least one of Ag, Al, Au, In, Ga, N, Zn, Se, P, and As and may be implemented using an intrinsic semiconductor material or a semiconductor material doped with a p-type dopant or an n-type dopant.

Although the embodiments have been described above, the embodiments are merely examples and not intended to limit the present invention, and it may be seen that a variety of modifications and applications not described above may be made by one of ordinary skill in the art without departing from the essential features of the embodiments. For example, the specific elements described in the embodiments may be implemented while being modified. In addition, it will be interpreted that differences related to the modifications and applications fall within the scope of the present invention defined by the appended claims.

The invention claimed is:

1. A semiconductor device comprising:
a substrate;
a bonding layer disposed on the substrate;
an electrode layer disposed on the bonding layer;
a semiconductor structure disposed on the electrode layer and including a first conductive semiconductor layer, a second conductive semiconductor layer, and an active layer disposed between the first conductive semiconductor layer and the second conductive semiconductor layer;
a first electrode electrically connected to the first conductive semiconductor layer; and a second electrode electrically connected to the second conductive semiconductor layer;
an intermediate layer disposed between the first electrode and the first conductive semiconductor layer;
a reflective layer disposed on the first electrode and the first conductive semiconductor layer, the reflective layer surrounding the intermediate layer and the first electrode and contacting sidewalls of the intermediate layer and sidewalls of the first electrode;
a capping layer disposed on the reflective layer and contacting a top surface of the first conductive semiconductor layer; and
a first electrode pad disposed on the capping layer, the first electrode pad being spaced apart from the first electrode and the intermediate layer in a lateral direction, such that the first electrode pad does not overlap with the first electrode in a vertical direction perpendicular to the lateral direction,
wherein the second conductive semiconductor layer includes a through-hole, and the second electrode is disposed in the through-hole and electrically connected to the electrode layer,
wherein electrode layer includes a groove,
wherein the second electrode is disposed in the groove, and
wherein an area ratio of an area of the first conductive semiconductor layer and an area of the intermediate layer is in a range of 1:0.02 to 1:0.06.

2. The semiconductor device of claim 1, wherein an area ratio of a maximum area of the electrode layer and a maximum area of the second electrode in the through-hole is in a range of 1:0.002 to 1:0.3.

3. The semiconductor device of claim 1, wherein a thickness ratio of a maximum thickness of the second conductive semiconductor layer and a maximum thickness of the second electrode is in a range of 1:0.006 to 1:0.25.

4. The semiconductor device of claim 1, wherein an area ratio of an area of the first conductive semiconductor layer and an area of the intermediate layer is in a range of 1:0.02 to 1:0.06.

5. The semiconductor device of claim 1, wherein
the second conductive semiconductor layer includes a first sub semiconductor layer disposed on the electrode layer and a second sub semiconductor layer disposed between the active layer and the first sub semiconductor layer,
a doping concentration of the first sub semiconductor layer is higher than a doping concentration of the second sub semiconductor layer, and
the doping concentration of the first sub semiconductor layer is greater than or equal to $2.0E^{20}$ atoms/cm$^3$.

6. The semiconductor device of claim 1, wherein
the semiconductor structure includes side surfaces including a first surface and a second surface,
the first surface is an inclined surface to which the first conductive semiconductor layer, the active layer, and the second conductive semiconductor layer are exposed, and
the second surface is an upper surface of the second conductive semiconductor layer, which extends from the first surface toward an edge of the semiconductor structure and is exposed.

7. The semiconductor device of claim 6, wherein the through-hole is disposed in the second surface and spaced apart from the active layer and the first conductive semiconductor layer.

8. The semiconductor device of claim 1, wherein
a thickness ratio of a maximum thickness of the second conductive semiconductor layer and a maximum thickness of the semiconductor structure is in a range of 1:2 to 1:18, and
the active layer emits light of which a peak wavelength is in a red wavelength band.

9. A semiconductor device package comprising:
a body;
a first electrode layer and a second electrode layer disposed at a lower portion of the body; and
a semiconductor device disposed in the body and electrically connected to the first electrode layer and the second electrode layer,
wherein the semiconductor device includes a substrate, a bonding layer disposed on the substrate, a third electrode layer disposed on the bonding layer, a semiconductor structure disposed on the third electrode layer and including a first conductive semiconductor layer, a second conductive semiconductor layer, and an active layer disposed between the first conductive semiconductor layer and the second conductive semiconductor layer, a first electrode electrically connected to the first conductive semiconductor layer, a second electrode electrically connected to the second conductive semiconductor layer, an intermediate layer disposed between the first electrode and the first conductive semiconductor layer; a reflective layer disposed on the first electrode and the first conductive semiconductor layer, the reflective layer surrounding the intermediate layer and the first electrode and contacting sidewalls of the intermediate layer and sidewalls of the first electrode; a capping layer disposed on the reflective layer and contacting a top surface of the first conductive semiconductor layer; and a first electrode pad disposed on the capping layer, the first electrode pad being spaced apart from the first electrode and the intermediate layer in a lateral direction, such that the first electrode pad does not overlap with the first electrode in a vertical direction perpendicular to the lateral direction, wherein the second conductive semiconductor layer includes a through-hole, and the second electrode is disposed in the through-hole and electrically connected to the first electrode, wherein a surface of the third electrode layer includes a groove, wherein the second electrode is disposed in the groove, wherein an area ratio of an area of the first conductive semiconductor layer and an area of the intermediate layer is in a range of 1:0.02 to 1:0.06, and wherein the semiconductor device directly overlaps with the first electrode layer and the second electrode layer, respectively in the vertical direction.

* * * * *